US007570182B2

(12) United States Patent
Sheba et al.

(10) Patent No.: US 7,570,182 B2

(45) Date of Patent: Aug. 4, 2009

(54) ADAPTIVE SPECTRAL NOISE SHAPING TO IMPROVE TIME TO DIGITAL CONVERTER QUANTIZATION RESOLUTION USING DITHERING

(75) Inventors: Mahbuba Moyeena Sheba, Richardson, TX (US); Robert B. Staszewski, Garland, TX (US); Khurram Waheed, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/853,182

(22) Filed: Sep. 11, 2007

(65) Prior Publication Data

US 2008/0068236 A1 Mar. 20, 2008

Related U.S. Application Data

(60) Provisional application No. 60/825,838, filed on Sep. 15, 2006.

(51) Int. Cl.
*H03M 1/06* (2006.01)

(52) U.S. Cl. ....................................... 341/118; 341/143

(58) Field of Classification Search ................. 341/118, 341/143, 120, 144, 155; 331/18; 327/146, 327/147

See application file for complete search history.

(56) References Cited

U.S. PATENT DOCUMENTS 4,034,367 A * 7/1977 Sugiyama et al. ........... 341/131
4,710,747 A * 12/1987 Holland ...................... 341/120
5,986,512 A * 11/1999 Eriksson ...................... 331/16
6,426,714 B1 * 7/2002 Ruha et al. .................. 341/143
6,809,598 B1 10/2004 Staszewski et al.
7,143,125 B2 * 11/2006 Gradishar et al. ........... 708/271
7,230,458 B2 * 6/2007 DaDalt ....................... 327/113
7,365,607 B2 * 4/2008 Fahim ........................ 331/1 A
7,394,418 B2 * 7/2008 Eikenbroek ................. 341/143
2005/0184901 A1 * 8/2005 DaDalt ....................... 341/157

(Continued)

OTHER PUBLICATIONS

M. Perrott, "Techniques for High Data Rate Modulation and Low Power Operation of Fractional-N Synthesizers," Ph.D Thesis, Massachusetts Institute of Technology, Sep. 1997, chapters 1-4.

(Continued)

*Primary Examiner*—Peguy JeanPierre
(74) *Attorney, Agent, or Firm*—Wade J. Brady, III; Frederick J. Telecky, Jr.

(57) ABSTRACT

A novel and useful apparatus for and method of improving the quantization resolution of a time to digital converter in a digital PLL using noise shaping. The TDC quantization noise shaping scheme is effective to reduce the TDC quantization noise to acceptable levels especially in the case of integer-N channel operation. The mechanism monitors the output of the TDC circuit and adaptively generates a dither (i.e. delay) sequence based on the output. The dither sequence is applied to the frequency reference clock used in the TDC which adjusts the timing alignment between the edges of the frequency reference clock and the RF oscillator clock. The dynamic alignment changes effectively shape the quantization noise of the TDC. By shaping the quantization noise, a much finer in-band TDC resolution is achieved resulting in the quantization noise being pushed out to high frequencies where the PLL low pass characteristic effectively filters it out.

42 Claims, 21 Drawing Sheets

U.S. PATENT DOCUMENTS

| | | | |
|---|---|---|---|
| 2005/0186920 | A1 | 8/2005 | Staszewski et al. |
| 2006/0033582 | A1 | 2/2006 | Staszewski et al. |
| 2006/0038710 | A1 | 2/2006 | Staszewski et al. |

OTHER PUBLICATIONS

R. B. Staszewski et al., "A First Multigigahertz Digitally Controlled Oscillator for Wireless Applications," IEEE Trans. Microwave Theory, vol. 51, No. 11, Nov. 2003, pp. 2154-2164.

R. B. Staszewski et al., "All-Digital PLL and GSM/EDGE Transmitter in 90nm CMOS," IEEE International Solid-State Circuits Conference (ISSCC) 2005, 316-317, 600.

S. D. Vamvakos et al., "Noise Analysis of Time-to-Digital Converter in All-Digital PLLs," IEEE Dallas/CAS Workshop on Design, Applications, Integration and Software, Oct. 2006, pp. 87-90.

* cited by examiner

ADAPTIVE SPECTRAL NOISE SHAPING TO IMPROVE TIME TO DIGITAL CONVERTER QUANTIZATION RESOLUTION USING DITHERING

REFERENCE TO PRIORITY APPLICATION

This application claims priority to U.S. Provisional Application No. 60/825,838, filed Sep. 15, 2006, entitled “Software Reconfigurable All Digital Phase Lock Loop”, incorporated herein by reference in its entirety.

FIELD OF THE INVENTION

The present invention relates to the field of data communications and more particularly relates to an apparatus for and method of improving the quantization noise resolution of a time to digital converter (TDC) in a digital PLL using adaptive feedback correction. The correction terms generated serve to reduce the TDC quantization noise within the PLL loop bandwidth.

BACKGROUND OF THE INVENTION

An important component in an all digital phase locked loop (ADPLL), which is used as an illustrative application of the invention, is the time to digital converter. The function of the TDC is to measure and quantize the time differences between a frequency reference clock FREF and the clock edges of the digitally controlled oscillator (DCO) output. This is done to compute the digital fractional part of the variable phase. In the frequency/phase detector, the differentiated timestamps and variable phase are subtracted from a frequency command word (FCW). The frequency error samples are then accumulated to create the phase error samples which are then filtered by the ADPLL loop filter(s).

In its simplest and most power efficient form, the TDC circuit is constructed as an array of inverter delay elements and flip-flop latches. The digital fractional phase is determined by passing the DCO oscillator clock (CKV) through the chain of inverters such that each inverter output produces a clock delayed by the amount of the propagation delay of an inverter with respect to the previous inverter output. The latches in the TDC are clocked at the reference frequency rate (FREF) and constitute a pseudo-thermometer code. This code is decoded to generate a quantized fractional phase between CKV and FREF in terms of inverter delays. Note that the fractional notion stems from the fact that the inverter delay is much smaller than either of the two clocks between which the phase is being computed.

The TDC quantization noise is broadband and additionally depends on the characteristics of the jitter of the DCO output clock. The ADPLL transfer function from TDC to DCO output, however, is low-pass in nature. Therefore, in-band TDC noise is one of the sources of phase noise at the output of the ADPLL. In fact, this can become one of the dominant noise contributors as the ADPLL loop bandwidth is widened. An analytical study of the ADPLL phase noise spectrum contributors at the RF output reveals that the TDC phase noise contribution can be minimized by either improving the TDC timing resolution, increasing the sampling rate or both.

Three potential internal sources of noise include: (1) the oscillator, (2) corruption of the reference frequency, and (3) the TDC operation of calculating the timing delay difference. It is noted that other than these three sources of internal phase noise, the system, due to its digital nature, is relatively immune from any time-domain or amplitude-domain perturbations and does not contribute to the phase noise. The TDC quantization noise can potentially produce undesirable effects such as idle tones (due to limit cycles) in the ADPLL output spectrum. Furthermore, this can cause degradation of root mean squared (RMS) phase error, close-in spectrum, etc.

The TDC quantization noise can cause significant performance degradation when the RF clock edges are varying slowly with respect to the FREF clock edges. In such cases, TDC essentially provides information-less constant readout. This is the case for integer-N channel operation, N being the ratio between CKV and FREF frequencies. For an integer-N channel, each FREF cycle will contain approximately same integer cycles of the RF clock.

The operation of the TDC, even though it possesses digital characteristics, generates phase noise due to fact that the FREF and DCO clock inputs possess jitter in the continuous time domain. The TDC contributed error comprises several components including raw quantization errors, TDC nonlinearity errors (such as integral and differential non-linearity) and random errors due to thermal and device hot carrier effects. Of these three mechanisms, the TDC quantization noise is the most dominant in the current CMOS process technology. As mentioned above, the TDC phase error degradation is particularly worse (i.e. may possess unwanted spikes) when caused by ill-conditioned TDC behavior for channels that are integer-N multiples of the reference frequency.

Thus, there is a need for a robust mechanism that is capable of reducing the TDC quantization noise in feedback circuits, such as ADPLL circuit. In the case of an ADPLL, the mechanism should be capable of reducing the TDC quantization noise for both integer as well as non-integer channels.

SUMMARY OF THE INVENTION

The present invention provides a solution to the problems of the prior art by providing an apparatus for and a method of improving the quantization noise resolution of a time to digital converter in a digital PLL using adaptive noise shaping. For example, The TDC is a component in the ADPLL that functions to measure the fractional time delay difference between the reference clock and the next rising edge of the RF oscillator clock. The term fractional time delay is attributed by introduction of a time resolution which is finer than both DCO and reference frequency clocks. The quantization of timing estimation performed by the TDC impacts the phase noise at the output of the ADPLL. The predominant source of the TDC error is its quantization noise. With proper design of the TDC, the noise in a deep-submicron CMOS process is relatively low and is adequate for cellular applications. Operating the ADPLL at or near the integer-N channels, however, produces peculiar behavior due to the insufficient randomization of the TDC quantization noise.

The quantization noise can produce undesirable effects such as idle tones (due to possible limit cycles) and degradation in TDC and the PLL output spectra and phase error, which in turn may impact the error vector magnitude (EVM) in a transmission system. This may become more of a problem in high performance, highly integrated CMOS based system on a chip (SoC) radio solutions. The TDC quantization noise shaping scheme of the present invention is effective to reduce the quantization noise to acceptable levels especially in the case of integer-N channel operation.

In operation, the TDC quantization noise shaping mechanism of the present invention monitors the output of the TDC circuit and adaptively generates a dither (i.e. a programmable delay) sequence in response thereto. The dither sequence is applied to the frequency reference clock used in the TDC which dynamically adjusts the alignment between the edges of the frequency reference clock and the RF oscillator clock. The dynamic dither-assisted alignment effectively noise shapes the quantization noise of the TDC. By appropriately shaping the quantization noise, a much finer TDC resolution can be achieved resulting in the quantization noise being pushed out to high frequencies where the ADPLL low pass loop filter effectively removes it by filtering.

Advantages of the proposed TDC quantization noise shaping mechanism include (1) implementations of the dither mechanisms are of low complexity, which do not require significant computing resources, thus no major changes to the existing ADPLL architecture are required; (2) the mechanism is adaptive whereby the changes in the reference frequency clock and RF oscillator clock timing are automatically tracked by the proposed mechanism; and (3) the mechanism can be parametrically made programmable whereby the dither element delay is a configurable parameter.

Note that the TDC resolution improvement mechanism of the present invention is employed in an all-digital PLL (ADPLL) used in a Digital Radio RF Processor (DRP) based transceiver. The same TDC enhancement techniques, however, can be employed similarly in other domains including but not limited to digital clock synchronization and timing recovery loops, etc.

Note that many aspects of the invention described herein may be constructed as software objects that are executed in embedded devices as firmware, software objects that are executed as part of a software application on either an embedded or non-embedded computer system running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC), Field Programmable Gate Array (FPGA), logic implementation schemes including programmable devices such as PALs, PLDs, etc., or as functionally equivalent discrete hardware components.

There is thus provided in accordance with the invention, a method of adaptively reducing quantization noise in a closed loop control system, the method comprising the steps of providing a reference analog quantity, providing a variable analog quantity, applying dithered spectral noise shaping to the reference analog quantity to generate a reference noise shaped quantity, calculating a quantized difference between the reference noise shaped quantity and the variable analog quantity and filtering the quantized difference to obtain a control signal of the variable analog quantity.

There is also provided in accordance with the invention, a method of reducing effects of quantization noise in a time to digital converter (TDC) in a phase locked loop (PLL) comprising determining a noise shaping sequence to apply to a frequency reference clock in accordance with an output of the TDC and applying the noise shaping sequence to the frequency reference clock thereby aligning edges of the frequency reference clock with respect to the edges of an RF oscillator clock with an adaptive offset such that TDC quantization noise is reduced.

There is further provided in accordance with the invention, a method of shaping time to digital converter (TDC) quantization noise for use in a phase locked loop (PLL), the method comprising the steps of providing a frequency reference clock signal, determining a dither to apply to the frequency reference clock signal in accordance with an output of the TDC and dithering the frequency reference clock signal in accordance with the dither to yield high pass frequency shaped quantization noise.

There is also provided in accordance with the invention, a method of improving resolution of a time to digital converter (TDC) for use in a phase locked loop (PLL) incorporating a controllable oscillator, the method comprising the steps of providing a frequency reference clock signal, estimating drift direction of the controllable oscillator, determining a phase offset of an RF output signal of the controllable oscillator with respect to the frequency reference clock signal, detecting low frequency activity in an output signal of the TDC and applying dithering to an input of the TDC in a direction opposite to the drift direction of the controllable oscillator, thereby frequency shaping quantization noise of the TDC.

There is further provided in accordance with the invention, a time to digital converter (TDC) for use in a phase locked loop (PLL) comprising measurement means for measuring a quantized time difference between a frequency reference clock and an RF oscillator clock, noise shaping means coupled to the measurement means, the noise shaping means comprising means for determining a dither to apply to the frequency reference clock in accordance with the measured quantized time difference and means for dithering the frequency reference clock in accordance with the dither resulting in high pass frequency noise shaping of the quantized time difference.

There is also provided in accordance with the invention, a radio comprising a transmitter, the transmitter comprising a phase locked loop (PLL) incorporating a time to digital converter (TDC) circuit, the TDC circuit comprising measurement means for measuring a quantized time difference between a frequency reference clock and a radio frequency (RF) oscillator clock, noise shaping means coupled to the measurement means, the noise shaping means comprising means for determining a dither to apply to the frequency reference clock in accordance with the measured quantized time difference, means for dithering the frequency reference clock in accordance with the sequence resulting in high pass frequency shaped TDC quantization noise, a receiver and a baseband processor coupled to the transmitter and the receiver.

There is further provided in accordance with the invention, a mobile communications device comprising a cellular radio comprising a transmitter and receiver, the transmitter comprising a phase locked loop (PLL) incorporating a time to digital converter (TDC) circuit, the TDC circuit comprising measurement means for measuring a quantized time difference between a frequency reference clock and a radio frequency (RF) oscillator clock, noise shaping means coupled to the measurement means, the noise shaping means comprising means for determining a dither to apply to the frequency reference clock in accordance with the measured quantized time difference, means for dithering the frequency reference clock in accordance with the dither resulting in high pass frequency shaped TDC quantization noise, a baseband processor coupled to the transmitter and receiver.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
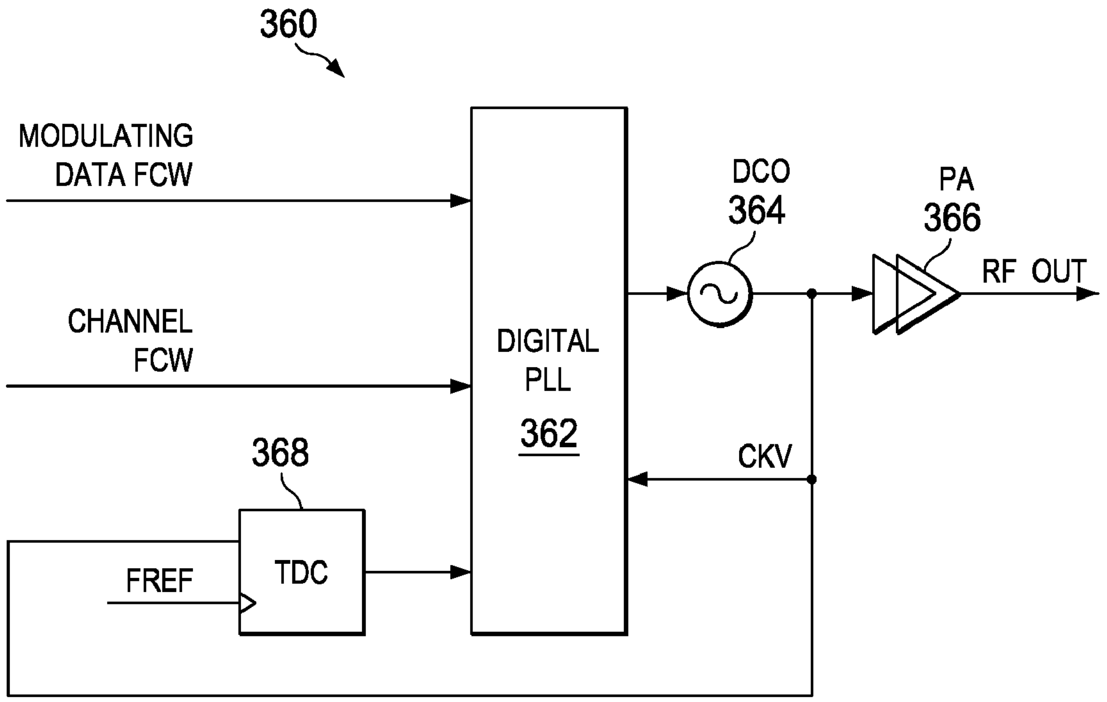
FIG. 1 is a simplified block diagram illustrating an example all-digital PLL (ADPLL)

The following notation is used throughout this document.

| Term | Definition |
|---|---|
| AC | Alternating Current |
| ACL | Asynchronous Connectionless Link |
| ACW | Amplitude Control Word |
| ADC | Analog to Digital Converter |
| ADPLL | All Digital Phase Locked Loop |
| AM | Amplitude Modulation |
| ASIC | Application Specific Integrated Circuit |
| AVI | Audio Video Interface |
| AWS | Advanced Wireless Services |
| BIST | Built-In Self Test |
| BMP | Windows Bitmap |
| BPF | Band Pass Filter |
| CMOS | Complementary Metal Oxide Semiconductor |
| CPU | Central Processing Unit |
| CU | Control Unit |
| CW | Continuous Wave |
| DAC | Digital to Analog Converter |
| dB | Decibel |
| DBB | Digital Baseband |
| DC | Direct Current |
| DCO | Digitally Controlled Oscillator |
| DCS | Digital Cellular System |
| DCXO | Digitally Controlled Crystal Oscillator |
| DFC | Digital-to-Frequency Conversion |
| DPA | Digitally Controlled Power Amplifier |
| DPPA | Digital Pre-Power Amplifier |
| DRAC | Digital to RF Amplitude Conversion |
| DRP | Digital RF Processor or Digital Radio Processor |
| DSL | Digital Subscriber Line |
| DSP | Digital Signal Processor |
| EDGE | Enhanced Data Rates for GSM Evolution |
| EDR | Enhanced Data Rate |
| EEPROM | Electrically Erasable Programmable Read Only Memory |
| EPROM | Erasable Programmable Read Only Memory |
| eSCO | Extended Synchronous Connection-Oriented |
| EVM | Error Vector Magnitude |
| FCC | Federal Communications Commission |
| FCW | Frequency Command Word |
| FIB | Focused Ion Beam |
| FM | Frequency Modulation |
| FPGA | Field Programmable Gate Array |
| FTW | Frequency Tuning Word |
| GMSK | Gaussian Minimum Shift Keying |
| GPS | Global Positioning System |
| GSM | Global System for Mobile communications |
| HB | High Band |
| HDL | Hardware Description Language |
| HFP | Hands Free Protocol |
| I/F | Interface |
| IC | Integrated Circuit |
| IEEE | Institute of Electrical and Electronics Engineers |
| IIR | Infinite Impulse Response |
| JPG | Joint Photographic Experts Group |
| LAN | Local Area Network |
| LB | Low Band |
| LDO | Low Drop Out |
| LO | Local Oscillator |
| LPF | Low Pass Filter |
| MAC | Media Access Control |
| MAP | Media Access Protocol |
| MBOA | Multiband OFDM Alliance |
| MIM | Metal Insulator Metal |
| Mod | Modulo |
| MOS | Metal Oxide Semiconductor |
| MP3 | MPEG-1 Audio Layer 3 |
| MPG | Moving Picture Experts Group |
| MUX | Multiplexer |

-continued

| Term | Definition |
|---|---|
| NZIF | Near Zero IF |
| OFDM | Orthogonal Frequency Division Multiplexing |
| OTW | Oscillator Tuning Word |
| PA | Power Amplifier |
| PAN | Personal Area Network |
| PC | Personal Computer |
| PCI | Personal Computer Interconnect |
| PCS | Personal Communications Service |
| PD | Phase Detector |
| PDA | Personal Digital Assistant |
| PE | Phase Error |
| PHE | Phase Error |
| PLL | Phase Locked Loop |
| PM | Phase Modulation |
| PPA | Pre-Power Amplifier |
| QoS | Quality of Service |
| RAM | Random Access Memory |
| RF | Radio Frequency |
| RFBIST | RF Built-In Self Test |
| RMS | Root Mean Squared |
| ROM | Read Only Memory |
| SAM | Sigma-Delta Amplitude Modulation |
| SAW | Surface Acoustic Wave |
| SCO | Synchronous Connection-Oriented |
| SEM | Spectral Emission Mask |
| SIM | Subscriber Identity Module |
| SoC | System on Chip |
| SRAM | Static Read Only Memory |
| SYNTH | Synthesizer |
| TDC | Time to Digital Converter |
| TDD | Time Division Duplex |
| TV | Television |
| UGS | Unsolicited Grant Services |
| USB | Universal Serial Bus |
| UWB | Ultra Wideband |
| VCO | Voltage Controlled Oscillator |
| WCDMA | Wideband Code Division Multiple Access |
| WiFi | Wireless Fidelity |
| WiMAX | Worldwide Interoperability for Microwave Access |
| WiMedia | Radio platform for UWB |
| WLAN | Wireless Local Area Network |
| WMA | Windows Media Audio |
| WMAN | Wireless Metropolitan Area Network |
| WMV | Windows Media Video |
| WPAN | Wireless Personal Area Network |
| XOR | Exclusive Or |
| ZIF | Zero IF |

Detailed Description of the Invention

The present invention is an apparatus for and method of improving the quantization noise resolution of a time to digital converter (TDC) in a digital PLL or all-digital PLL (ADPLL) using noise shaping. In particular, the invention is intended for use in a digital radio transmitter and receiver but can be used in other applications as well, such as clock synchronization and timing recovery control loops including but not limited to a general communication channel or a control system for mitigation of feedback quantization noise. The TDC quantization noise shaping scheme of the present invention is effective to reduce TDC quantization noise levels to acceptable levels especially in the case of integer-N channel operation, where the performance impact may be most severe.

To aid in understanding the principles of the present invention, the description is provided in the context of a digital RF processor (DRP) transmitter and receiver that may be adapted to comply with a particular wireless communications standard such as GSM, EDGE, Bluetooth, WLAN, WiMax, WCDMA, LTE, etc. It is appreciated, however, that the invention is not limited to use with any particular communication standard or circuit and may be used in optical, wired, wireless and control system applications. Further, the use of the invention in PLLs is not limited to use with a specific modulation scheme but is applicable to any modulation scheme including both digital and analog modulation. The invention is applicable in situations where it is desirable to reduce the quantization noise generated by a time to digital converter circuit in a digital PLL or feedback control system.

Although the TDC quantization noise shaping mechanism in a PLL is applicable to numerous wireless communication standards and can be incorporated in numerous types of wireless or wired communication devices such a multimedia player, mobile station, cellular phone, PDA, DSL modem, WPAN device, etc., it is described in the context of a digital RF processor (DRP) based transmitter that may be adapted to comply with a particular wireless communications standard such as GSM, Bluetooth, EDGE, WLAN, WiMax, WCDMA, LTE, etc. It is appreciated, however, that the invention is not limited to use with any particular communication standard and may be used in optical, wired and wireless applications. Further, the invention is not limited to use with a specific modulation scheme but is applicable to any modulation scheme including both digital and analog modulation schemes. This functionality is often also employed in feedback control systems that may be used for clock synchronization as well as timing recovery loops. Furthermore, the proposed scheme can be expanded to aid in mitigation of interference affects due to the possible coupling of the transmit RF output signal back into the frequency reference input often found in integrated radio solutions.

Note that throughout this document, the term communications device is defined as any apparatus or mechanism adapted to transmit, receive or transmit and receive data through a medium. The term communications transceiver or communications device is defined as any apparatus or mechanism adapted to transmit and receive data through a medium. The communications device or communications transceiver may be adapted to communicate over any suitable medium, including wireless or wired media. Examples of wireless media include RF, infrared, optical, microwave, UWB, Bluetooth, GSM, EDGE, WiMAX, WiMedia, WiFi, 3G/4G or any other broadband medium, etc. Examples of wired media include twisted pair, coaxial, optical fiber, any wired interface (e.g., USB, Firewire, Ethernet, etc.). The term Ethernet network is defined as a network compatible with any of the IEEE 802.3 Ethernet standards, including but not limited to 10Base-T, 100Base-T or 1000Base-T over shielded or unshielded twisted pair wiring. The terms communications channel, link and cable are used interchangeably. The notation DRP is intended to denote either a Digital RF Processor or Digital Radio Processor. References to a Digital RF Processor infer a reference to a Digital Radio Processor and vice versa. The term data frequency command word (FCW) is defined as the demanded frequency normalized by the reference frequency (FREF).

The term multimedia player or device is defined as any apparatus having a display screen and user input means that is capable of playing audio (e.g., MP3, WMA, etc.), video (AVI, MPG, WMV, etc.) and/or pictures (JPG, BMP, etc.) and/or other content widely identified as multimedia. The user input means is typically formed of one or more manually operated switches, buttons, wheels or other user input means. Examples of multimedia devices include pocket sized personal digital assistants (PDAs), personal media player/recorders, cellular telephones, handheld devices, and the like.

Some portions of the detailed descriptions which follow are presented in terms of procedures, logic blocks, processing, steps, and other symbolic representations of operations on data bits within a computer memory. These descriptions and representations are the means used by those skilled in the data processing arts to most effectively convey the substance of their work to others skilled in the art. A procedure, logic block, process, etc., is generally conceived to be a self-consistent sequence of steps or instructions leading to a desired result. The steps require physical manipulations of physical quantities. Usually, though not necessarily, these quantities take the form of electrical or magnetic signals capable of being stored, transferred, combined, compared and otherwise manipulated in a computer system. It has proven convenient at times, principally for reasons of common usage, to refer to these signals as bits, bytes, words, values, elements, symbols, characters, terms, numbers, or the like.

It should be born in mind that all of the above and similar terms are to be associated with the appropriate physical quantities they represent and are merely convenient labels applied to these quantities. Unless specifically stated otherwise as apparent from the following discussions, it is appreciated that throughout the present invention, discussions utilizing terms such as 'processing,' 'computing,' 'calculating,' 'determining,' 'displaying' or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The invention can take the form of an entirely hardware embodiment, an entirely software embodiment or an embodiment containing a combination of hardware and software elements. In one embodiment, a portion of the mechanism of the invention is implemented in software, which includes but is not limited to firmware, resident software, object code, assembly code, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium is any apparatus that can contain, store, communicate, propagate, or transport the program for use by or in connection with the instruction execution system, apparatus, or device, e.g., floppy disks, removable hard drives, computer files comprising source code or object code, flash semiconductor memory (USB flash drives, etc.), ROM, EPROM, or other semiconductor memory devices.

Digital RF Processor (DRP)

A simplified block diagram illustrating an example ADPLL based DRP polar transmitter is shown in FIG. 1. The transmitter portion of the DRP, generally referenced 360, comprises a digital logic portion of a digital PLL with wideband frequency modulation capability 362, digitally controlled oscillator (DCO) 364, power amplifier (PA) 366 and time to digital converter (TDC) 368. For clarity sake in this discussion, several blocks in the ADPLL loop have been merged into the frequency synthesizer block. This block comprises the reference and oscillator phase accumulators, phase detector, loop filter, normalization, etc., which are described in more detail infra.

In operation, the modulating data frequency command word (FCW) and the channel FCW, both digital values, are input to the frequency synthesizer which is adapted to generate a digital tuning word to the DCO. The DCO produces a digital clock CKV in the RF frequency band. The CKV clock is amplified by the PA and terminated with an antenna. In the feedback path, the CKV clock is used to retime the FREF clock. The FREF clock is the stable reference frequency clock. The FREF clock is input to the D input of a retiming element (not shown) (e.g., retimer, flip flop, register, etc.) and is clocked by the CKV clock. The output generated is the retimed frequency reference clock CKR. The operation of the flip flop/register serves to strip FREF of its critical timing information and generate a retimed CKR clock. It is this CKR clock that is subsequently distributed and used throughout the system. As a result of the retiming operation, the edges of the CKR clock are now synchronous with the RF oscillator clock CKV. This results in the time separation between the closest CKR and CKV edges to be time invariant.

Thus, the entire radio, including a digital RF processor, the digital baseband circuitry and the application processor, is operated in a clock synchronous mode wherein every clock in the system is either derived from or synchronized to the RF oscillator clock. Thus, the frequency reference clock is made synchronous to the oscillator clock and this retimed frequency reference clock is used to drive the entire digital logic circuitry of the SoC chip. This ensures that the different clock edges throughout the system will not exhibit mutual drift.

The CKR clock can be used to drive the digital logic since the digital logic is not sensitive to the accuracy of the edges, as long as the edges are compliant with the relevant timing specifications. In order to eliminate injection pulling effect in the entire chip, all the digital logic including DSP or other processors is adapted to operate on the CKR clock or clocks that are derived from or synchronous to the CKV clock.

All Digital Phase Locked Loop (ADPLL)

Figure 2:
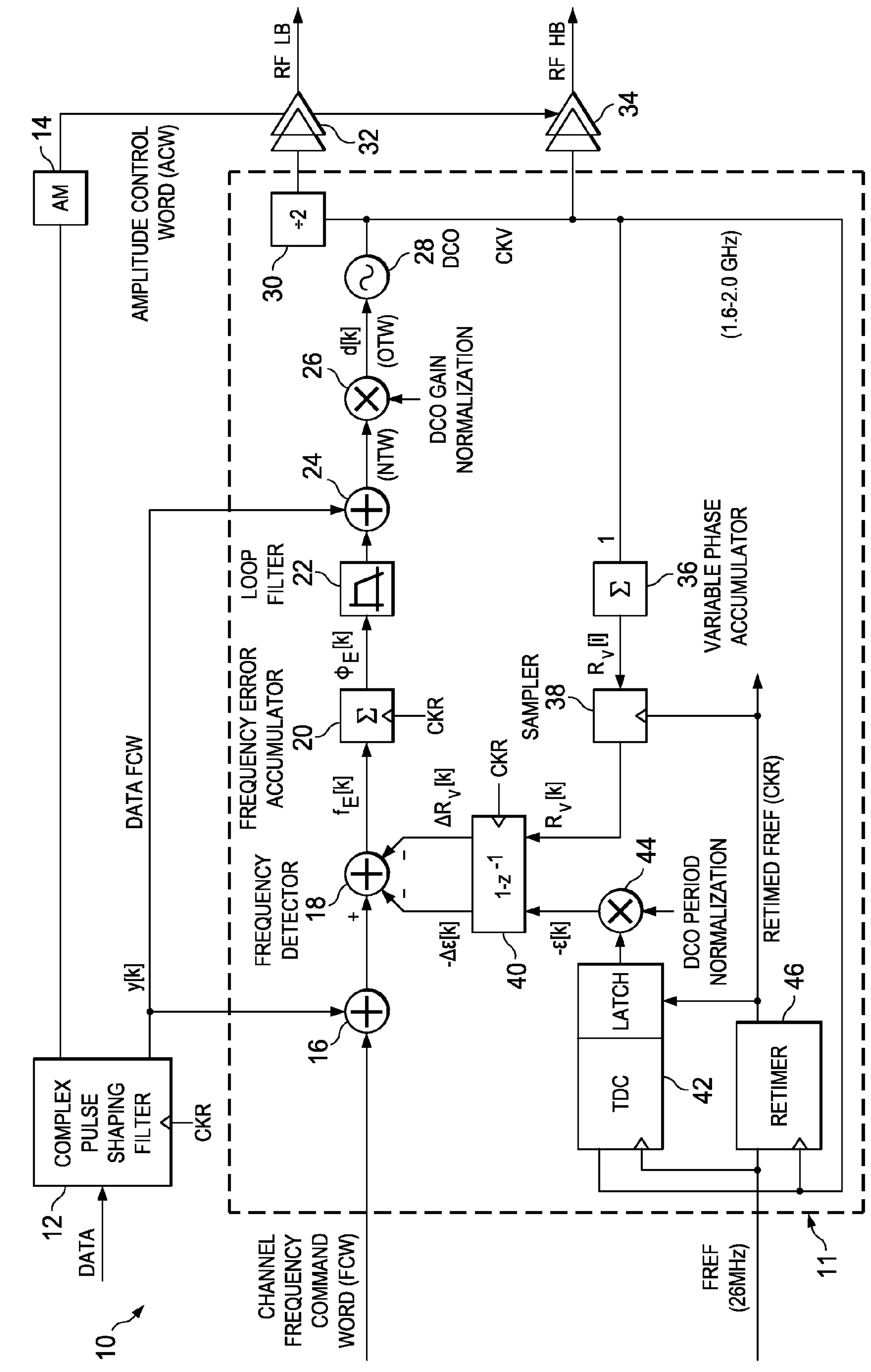
FIG. 2 is a block diagram illustrating the example ADPLL based DRP polar transmitter.

A block diagram illustrating an ADPLL-based polar transmitter for wireless applications is shown in FIG. 2. A more detailed description of the operation of the ADPLL can be found in U.S. Patent Publication No. 2006/0033582A1, published Feb. 16, 2006, to Staszewski et al., entitled "Gain Calibration of a Digital Controlled Oscillator," U.S. Patent Publication No. 2006/0038710A1, published Feb. 23, 2006, Staszewski et al., entitled "Hybrid Polar/Cartesian Digital Modulator" and U.S. Pat. No. 6,809,598, to Staszewski et al., entitled "Hybrid Of Predictive And Closed-Loop Phase-Domain Digital PLL Architecture," all of which are incorporated herein by reference in their entirety.

For illustration purposes only, the transmitter, as shown, is adapted for the GSM/EDGE/WCDMA cellular standards. It is appreciated, however, that one skilled in the communication arts can adapt the transmitter illustrated herein to other modulations and communication standards as well without departing from the spirit and scope of the present invention.

The transmitter, generally referenced 10, is well-suited for a deep-submicron CMOS implementation. The transmitter comprises a complex pulse shaping filter 12, amplitude modulation (AM) block 14 and ADPLL 11. The circuit is operative to perform complex modulation in the polar domain in addition to the generation of the local oscillator (LO) signal for the receiver. All clocks internal to the system are derived directly from this source. Note that the transmitter is constructed using digital techniques that exploit the high speed and high density of the advanced CMOS, while avoiding problems related to voltage headroom. The ADPLL circuit replaces a conventional RF synthesizer architecture (based on a voltage-controlled oscillator (VCO) and a phase/frequency detector and charge-pump combination), with a digitally controlled oscillator (DCO) 28 and a time-to-digital converter (TDC) 42. All inputs and outputs are digital and some even at multi-GHz frequency.

The core of the ADPLL is a digitally controlled oscillator (DCO) 28 adapted to generate the RF oscillator clock CKV. The oscillator core (not shown) operates at least twice the 1.6-2.0 GHz high band frequency or at least four times the 0.8-1.0 GHz low band frequency. The output of the DCO is then divided for precise generation of RX quadrature signals, and for use as the transmitter's carrier frequency. The single DCO is shared between transmitter and receiver and is used for both the high frequency bands (HB) and the low frequency bands (LB). In additional to the integer control of the DCO, at least 3-bits of the minimal varactor size used are dedicated for ΣΔ dithering in order to improve frequency resolution. The DCO comprises a plurality of varactor banks, which may be realized as n-poly/n-well inversion type MOS capacitor (MOSCAP) devices or Metal Insulator Metal (MIM) devices that operate in the flat regions of their C-V curves to assist digital control. The output of the DCO is input to the RF high band pre-power amplifier (PPA) 34. It is also input to the RF low band pre-power amplifier 32 after divide by two via divider 30.

The expected variable frequency $f_V$ is related to the reference frequency $f_R$ by the frequency command word (FCW).

$$FCW[k] \equiv \frac{E(f_V[k])}{f_R} \tag{1}$$

The FCW is time variant and is allowed to change with every cycle $T_R=1/f_R$ of the frequency reference clock. With $W_F=24$ the word length of the fractional part of FCW, the ADPLL provides fine frequency control with 1.5 Hz accuracy, according to:

$$\Delta f_{res} = \frac{f_R}{2^{W_F}} \tag{2}$$

The number of integer bits $W_I=8$ has been chosen to fully cover the GSM/EDGE and partial WCDMA band frequency range of $f_V$=1,600-2,000 MHz with an arbitrary reference frequency $f_R \geqq 8$ MHz.

The ADPLL operates in a digitally-synchronous fixed-point phase domain as follows: The variable phase accumulator 36 determines the variable phase $R_V[i]$ by counting the number of rising clock transitions of the DCO oscillator clock CKV as expressed below.

$$R_V[i] = \sum_{l=0}^{i} 1 \tag{3}$$

The index i indicates the DCO edge activity. The variable phase $R_V[i]$ is sampled via sampler 38 to yield sampled FREF variable phase $R_V[k]$, where k is the index of the FREF edge activity. The sampled FREF variable phase $R_V[k]$ is fixed-point concatenated with the normalized time-to-digital converter (TDC) 42 output $\epsilon[k]$. The TDC measures and quantizes the time differences between the frequency reference FREF and the DCO clock edges. The sampled differentiated (via block 40) variable phase is subtracted from the frequency command word (FCW) by the digital frequency detector 18. The frequency error $f_E[k]$ samples $$f_E[k]=FCW-[(R_V[k]-\epsilon[k])-(R_V[k-1]-\epsilon[k-1])] \tag{4}$$

are accumulated via the frequency error accumulator 40 to create the phase error $\phi_E[k]$ samples $$\phi_E[k] = \sum_{l=0}^{k} f_E[k] \tag{5}$$

which are then filtered by a fourth order IIR loop filter 22 and scaled by a proportional loop attenuator α. A parallel feed with coefficient ρ adds an integrated term to create type-II loop characteristics which suppress the DCO flicker noise.

The IIR filter is a cascade of four single stage filters, each satisfying the following equation:

$$y[k]=(1-\lambda)\cdot y[k-1]+\lambda\cdot x[k] \tag{6}$$

wherein x[k] is the current input;

y[k] is the current output;

k is the time index;

λ is the configurable coefficient;

The 4-pole IIR loop filter attenuates the reference and TDC quantization noise with an 80 dB/dec slope, primarily to meet the GSM/EDGE spectral mask requirements at 400 kHz offset. The filtered and scaled phase error samples are then multiplied by the DCO gain $K_{DCO}$ normalization factor $f_R/\hat{K}_{DCO}$ via multiplier 26, where $f_R$ is the reference frequency and $\hat{K}_{DCO}$ is the DCO gain estimate, to make the loop characteristics and modulation independent from $K_{DCO}$. The modulating data is injected into two points of the ADPLL for direct frequency modulation, via adders 16 and 24. A hitless gear-shifting mechanism for the dynamic loop bandwidth control serves to reduce the settling time. It changes the loop attenuator α several times during the frequency locking while adding the $(\alpha_1/\alpha_2-1)\phi_1$ DC offset to the phase error, where indices 1 and 2 denote before and after the event, respectively. Note that $\phi_1=\phi_2$, since the phase is to be continuous.

The FREF input is resampled by the RF oscillator clock CKV via retimer block 46 which may comprise a flip flop or register clocked by the reference frequency FREF. The resulting retimed clock (CKR) is distributed and used throughout the system. This ensures that the massive digital logic is clocked after the quiet interval of the phase error detection by the TDC. Note that in the example embodiment described herein, the ADPLL is a discrete-time sampled system implemented with all digital components connected with all digital signals.

ADPLL Time Domain Model

Figure 3:
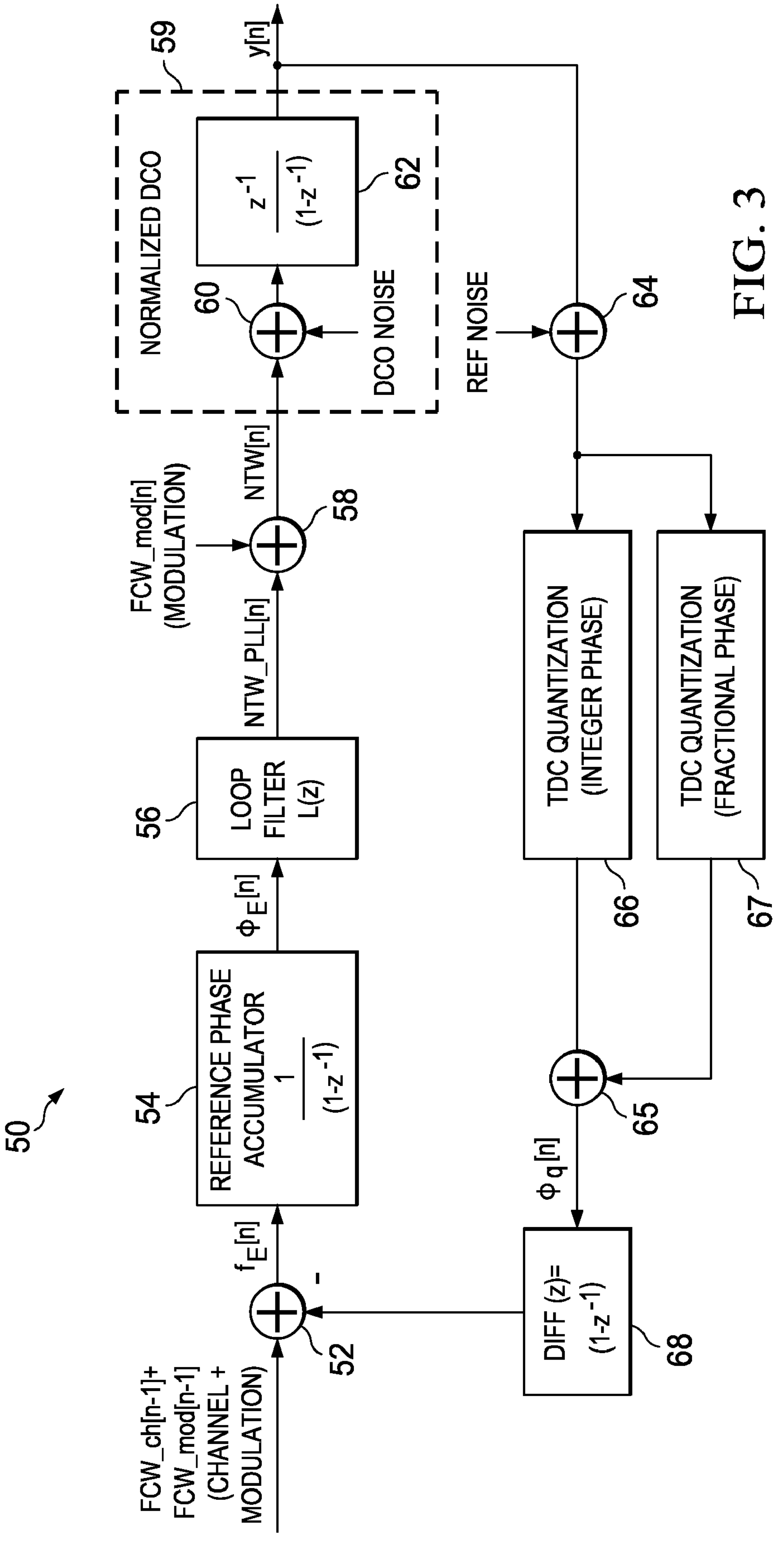
FIG. 3 is a block diagram illustrating a discrete time domain model of the ADPLL.

A block diagram illustrating a discrete time domain model of the ADPLL is shown in FIG. 3. The model, generally referenced 50, comprises frequency detector 52, adder 58 for injecting data modulation input, conceptual adder 60 for injecting DCO noise, conceptual adder 64 for injecting frequency reference noise, integrator block 54 for converting frequency to phase, loop filter block 56, normalized DCO block 59, TDC quantization integer phase 66 and fractional phase 67 blocks for measuring delay between the frequency reference and the DCO output significant edges, adder 65 and differentiation block 68 for differentiating the TDC timestamps (i.e. conversion to frequency).

The TDC block 66 in this feedback system quantizes the phase of the output CKV clock denoted by $\phi_v[n]$. The TDC quantization is a nonlinear operation within the loop that may introduce oscillations (referred to as limit cycles in control system analysis) within its quantization interval, especially for integer-N channel frequencies. This oscillation frequency varies depending on the initial state of ADPLL. When the oscillation frequency of the quantization noise is low, the loop filter is unable to filter the idle tones and the overall system performance (i.e. RMS phase error) suffers. The RMS phase errors in these cases can be worse than the theoretical performance of TDC quantization which assumes the quantization noise to be white and uniformly distributed over a quantization interval. In real systems, however, noise contributions from other sources will reduce this effect by adding randomization to the quantization process.

If the quantization noise from the TDC is high-pass frequency shaped, however, the contribution of the TDC quantization noise can be further reduced. The low pass filter in the ADPLL loop is operative to remove the high frequency content of the noise. Thus, the present invention provides a signal processing algorithm, method and system that performs noise shaping on this quantization noise so as to push the quantization noise outside loop bandwidth, thereby allowing the ADPLL low pass loop filter to remove it.

Single Chip Radio

Figure 8:
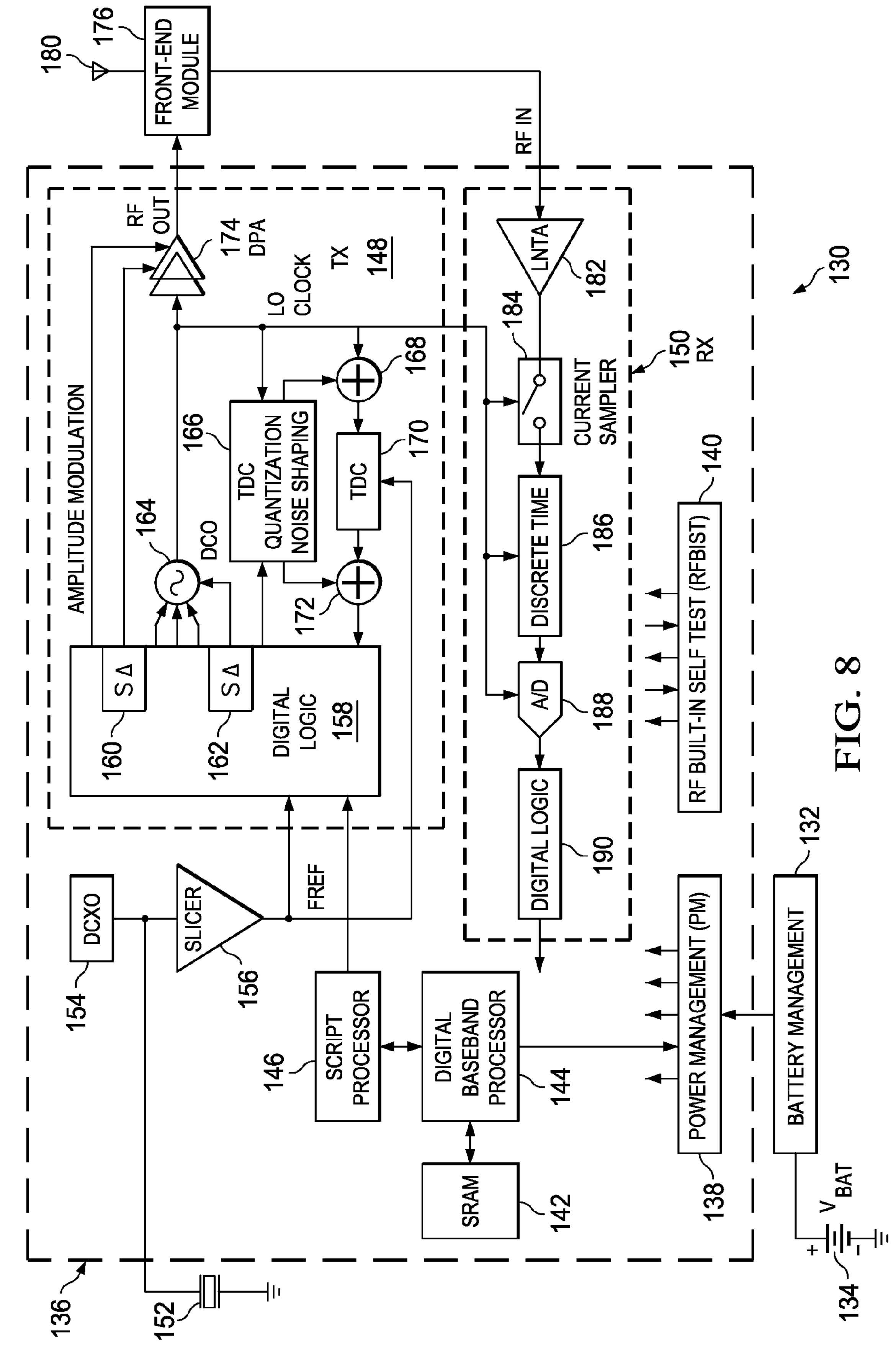
FIG. 8 is a block diagram illustrating a single chip radio incorporating an all-digital local oscillator based polar transmitter and digitally-intensive receiver, as well as the TDC quantization noise shaping mechanism of the present invention.

A block diagram illustrating a single chip radio incorporating an all-digital local oscillator based polar transmitter and digitally-intensive receiver, as well as the TDC quantization noise shaping mechanism of the present invention is shown in FIG. 8. For illustration purposes only, the transmitter, as shown, is adapted for the GSM/EDGE/WCDMA cellular standards. It is appreciated, however, that one skilled in the communication arts can adapt the transmitter illustrated herein to other modulations and communication standards as well without departing from the spirit and scope of the present invention.

The radio circuit, generally referenced 130, comprises a radio integrated circuit 136 coupled to a crystal 152, front end module 176 and battery management circuit 132. The radio chip 136 comprises a script processor 146, digital baseband (DBB) processor 144, memory 142 (e.g., static RAM), TX block 148, RX block 150, digitally controlled crystal oscillator (DCXO) 154, slicer 156, RF front-end module 176 and antenna 180, power management unit 138, RF built-in self test (BIST) 140, battery 134 and battery management circuit 132. The TX block comprises high speed and low speed digital logic block 158 including ΣΔ modulators 160, 162, digitally controlled oscillator (DCO) 164, digitally controlled power amplifier (DPA) 174 or pre power amplifier (PPA), time to digital converter (TDC) circuit 170 and TDC quantization noise shaping block 166. The ADPLL and transmitter generate various radio frequency signals. The RX block comprises a low noise transconductance amplifier 182, current sampler 184, discrete ime processing block 186, analog to digital converter (ADC) 188 and digital logic block 190.

In accordance with the invention, the radio also comprises TDC quantization noise shaping block 166 operative to reduce the quantization noise contribution of the TDC. It is noted that the TDC quantization noise shaping mechanism is especially applicable in an ADPLL circuit.

The principles presented herein have been used to develop three generations of a Digital RF Processor (DRP): single-chip Bluetooth, GSM and GSM/EDGE radios realized in 130 nm, 90 nm and 65 nm digital CMOS process technologies, respectively. The common architecture is highlighted in FIG. 4 with features added specific to the cellular radio. The all digital phase locked loop (ADPLL) based transmitter employs a polar architecture with all digital phase/frequency and amplitude modulation paths. The receiver employs a discrete-time architecture in which the RF signal is directly sampled and processed using analog and digital signal processing techniques.

A key component is the digitally controlled oscillator (DCO) 164, which avoids any analog tuning controls. A digitally-controlled crystal oscillator (DCXO) generates a high-quality base station-synchronized frequency reference such that the transmitted carrier frequencies and the received symbol rates are accurate to within 0.1 ppm. Fine frequency resolution is achieved through high-speed ΣΔ dithering of its varactors. Digital logic built around the DCO realizes an all-digital PLL (ADPLL) that is used as a local oscillator for both the transmitter and receiver. The polar transmitter architecture utilizes the wideband direct frequency modulation capability of the ADPLL and a digitally controlled power amplifier (DPA) 174 for the amplitude modulation. The DPA operates in near-class-E mode and uses an array of nMOS transistor switches to regulate the RF amplitude and acts as a digital-to-RF amplitude converter (DRAC). It is followed by a matching network and an external front-end module 176, which comprises a power amplifier (PA), a transmit/receive switch for the common antenna 180 and RX surface acoustic wave (SAW) filters. Fine amplitude resolution is achieved through high-speed ΣΔ dithering of the DPA nMOS transistors.

The receiver 150 employs a discrete-time architecture in which the RF signal is directly sampled at the Nyquist rate of the RF carrier and processed using analog and digital signal processing techniques. The transceiver is integrated with a script processor 146, dedicated digital base band processor 144 (i.e. ARM family processor or DSP) and SRAM memory 142. The script processor handles various TX and RX calibration, compensation, sequencing and lower-rate data path tasks and encapsulates the transceiver complexity in order to present a much simpler software programming model.

The frequency reference (FREF) is generated on-chip by a 26 MHz (could be 38.4 MHz or other) digitally controlled crystal oscillator (DCXO) 154 coupled to slicer 156. An integrated power management (PM) system is connected to an external battery management circuit 132 that conditions and stabilizes the supply voltage. The PM comprises multiple low drop out (LDO) regulators that provide internal supply voltages and also isolate supply noise between circuits, especially protecting the DCO. The RF built-in self-test (RFBIST) 140 performs autonomous phase noise and modulation distortion testing, various loopback configurations for bit-error rate measurements and implements various DPA calibration and BIST procedures. The transceiver is integrated with the digital baseband, SRAM memory in a complete system-on-chip (SoC) solution. Almost all the clocks on this SoC are derived from and are synchronous to the RF oscillator clock. This helps to reduce susceptibility to the noise generated through clocking of the massive digital logic.

The transmitter comprises a polar architecture in which the amplitude and phase/frequency modulations are implemented in separate paths. Transmitted symbols generated in the digital baseband (DBB) processor are first pulse-shape filtered in the Cartesian coordinate system. The filtered in-phase (I) and quadrature (Q) samples are then converted through a CORDIC algorithm into amplitude and phase samples of the polar coordinate system. The phase is then differentiated to obtain frequency deviation. The polar signals are subsequently conditioned through signal processing to sufficiently increase the sampling rate in order to reduce the quantization noise density and lessen the effects of the modulating spectrum replicas.

A more detailed description of the operation of the ADPLL can be found in U.S. Patent Publication No. 2006/0033582A1, published Feb. 16, 2006, to Staszewski et al., entitled "Gain Calibration of a Digital Controlled Oscillator," U.S. Patent Publication No. 2006/0038710A1, published Feb. 23, 2006, Staszewski et al., entitled "Hybrid Polar/Cartesian Digital Modulator" and U.S. Pat. No. 6,809,598, to Staszewski et al., entitled "Hybrid Of Predictive And Closed-Loop Phase-Domain Digital PLL Architecture," all of which are incorporated herein by reference in their entirety.

Mobile Device/Cellular Phone/PDA System

Figure 9:
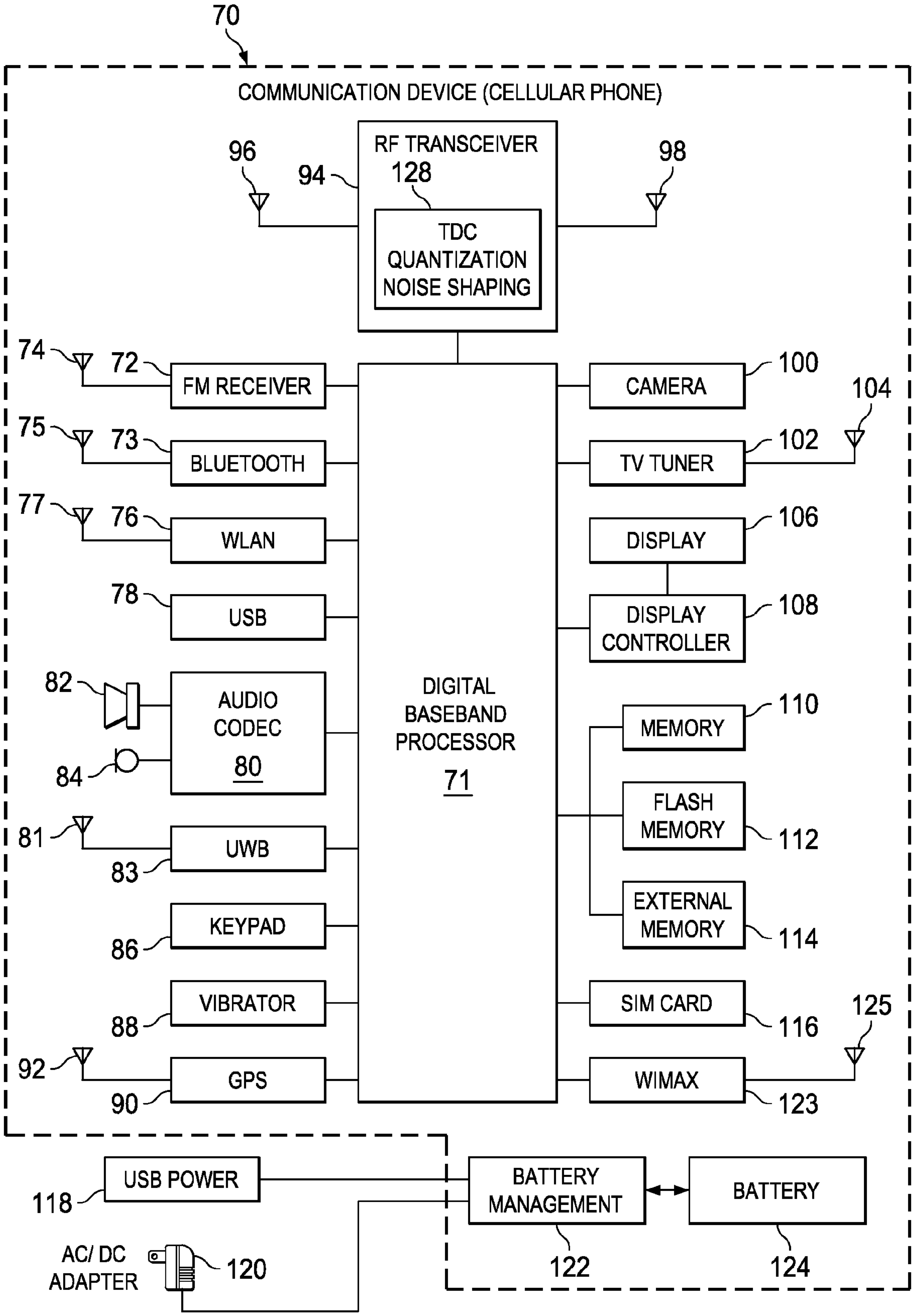
FIG. 9 is a simplified block diagram illustrating an example communication device incorporating the TDC quantization noise shaping mechanism of the present invention.

A simplified block diagram illustrating an example communication device incorporating the TDC quantization noise shaping mechanism of the present invention is shown in FIG. 9. The communication device may comprise any suitable wired or wireless device such as a multimedia player, mobile station, mobile device, cellular phone, PDA, wireless personal area network (WPAN) device, Bluetooth EDR device, etc. For illustration purposes only, the communication device is shown as a cellular phone or smart phone. Note that this example is not intended to limit the scope of the invention as the TDC quantization noise shaping mechanism of the present invention can be implemented in a wide variety of wireless and wired communication devices.

The cellular phone, generally referenced 70, comprises a baseband processor or CPU 71 having analog and digital portions. The basic cellular link is provided by the RF transceiver 94 and related one or more antennas 96, 98. A plurality of antennas is used to provide antenna diversity which yields improved radio performance. The cell phone also comprises internal RAM and ROM memory 110, Flash memory 112 and external memory 114.

In accordance with the invention, the RF transceiver comprises a TDC quantization noise shaping block 128 operative to reduce effect of the quantization noise generated by the TDC in the ADPLL circuit, as described in more detail infra. The benefits include: lower modulation distortion and better modulation mask in during transmission, as well as lower close-in phase noise and better sensitivity and selectivity during reception. In operation, the TDC quantization noise shaping mechanism may be implemented as hardware, as software executed as a task on the baseband processor 71 or a combination of hardware and software. Implemented as a software task, the program code operative to implement the TDC quantization noise shaping mechanism of the present invention is stored in one or more memories 110, 112 or 114.

Several user interface devices include microphone 84, speaker 82 and associated audio codec 80, a keypad for entering dialing digits 86, vibrator 88 for alerting a user, camera and related circuitry 100, a TV tuner 102 and associated antenna 104, display 106 and associated display controller 108 and GPS receiver 90 and associated antenna 92.

A USB interface connection 78 provides a serial link to a user's PC or other device. An FM receiver 72 and antenna 74 provide the user the ability to listen to FM broadcasts. WLAN radio and interface 76 and antenna 77 provide wireless connectivity when in a hot spot or within the range of an ad hoc, infrastructure or mesh based wireless LAN network. A Bluetooth EDR radio and interface 73 and antenna 75 provide Bluetooth wireless connectivity when within the range of a Bluetooth wireless network. Further, the communication device 70 may also comprise a WiMAX radio and interface 123 and antenna 125. SIM card 116 provides the interface to a user's SIM card for storing user data such as address book entries, etc. The communication device 70 also comprises an Ultra Wideband (UWB) radio and interface 83 and antenna 81. The UWB radio typically comprises an MBOA-UWB based radio.

Portable power is provided by the battery 124 coupled to battery management circuitry 122. External power is provided via USB power 118 or an AC/DC adapter 120 connected to the battery management circuitry which is operative to manage the charging and discharging of the battery 124.

Time to Digital Converter (TDC)

Figure 10:
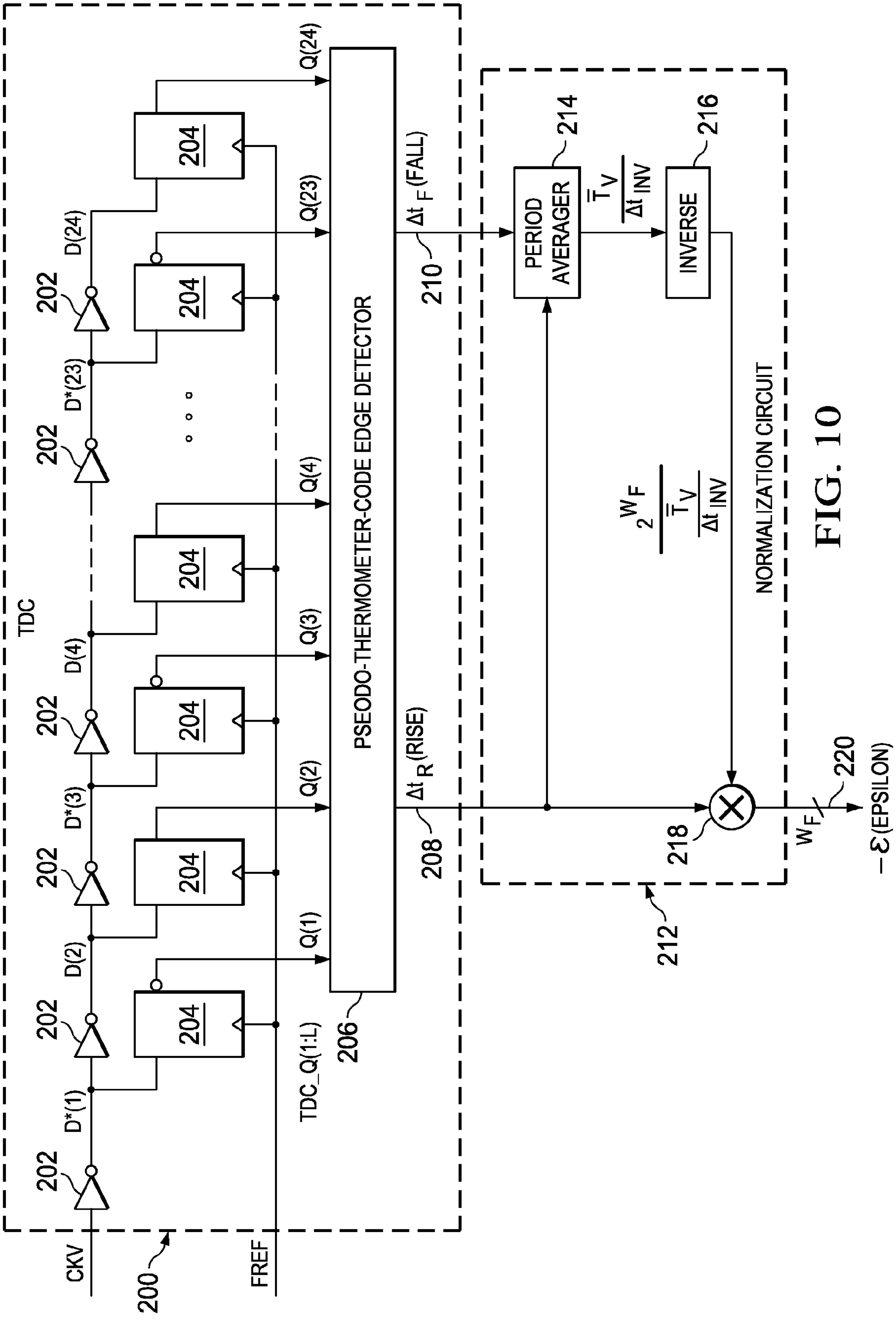
FIG. 10 is a block diagram illustrating a simple implementation of the time to digital converter (TDC) circuit in detail, together with its output normalization.
Figure 11:
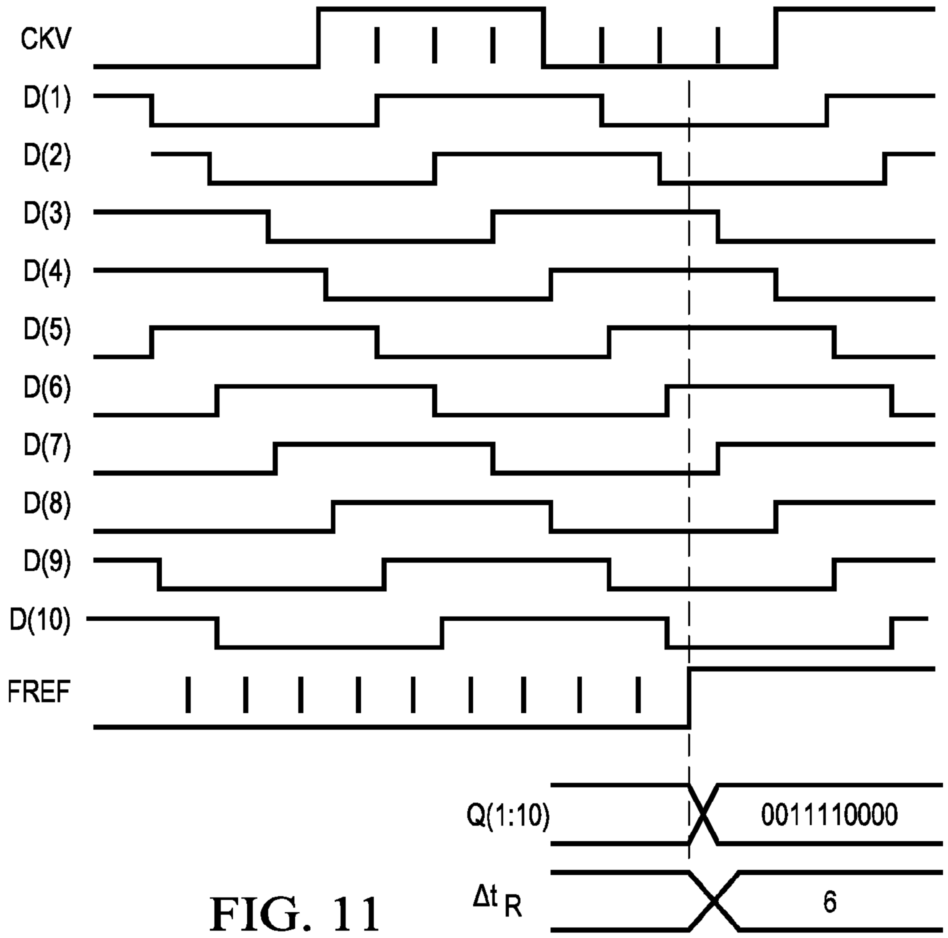
FIG. 11 is a timing diagram illustrating the waveforms generated within the time to digital converter with respect to the frequency reference clock and the RF oscillator clock.

A block diagram illustrating a time to digital converter (TDC) circuit in more detail is shown in FIG. 10. A timing diagram illustrating the waveforms generated within the time to digital converter with respect to the frequency reference clock and the RF oscillator clock is shown in FIG. 11. With reference to FIGS. 10 and 11, the TDC circuit, generally referenced 200, is constructed as an array of inverter delay elements 202 and registers 204. In this example, the delay comprises 24 inventers but may be modified to any length depending on the requirements of the particular application. The digital fractional phase is determined by passing the DCO oscillator clock CKV through the chain of inverters such that each inverter output produces a clock slightly delayed from the previous inverter. The staggered clock phases D(1) through D(24) are then sampled by the same frequency reference clock FREF. The sampling is performed on the rising edge of FREF, but a falling edge could also be used. We denote the active edge, whether rising or falling, as a significant edge. This is accomplished by an array of registers whose Q and Q bar outputs, Q(1) through Q(24), form a pseudo thermometer code which is input to the pseudo-thermometer code edge detector 206. As a result of this arrangement, there will be a series of ones and zeros presented to the input of the detector.

In the example presented in FIG. 11, the period of the CKV clock is eight periods, i.e. $T_V=8$. There is a series of four ones which starts at position 3 and extends to position 6. The series of four zeros follow starting at index 7. The position of the detected transition from 1 to 0 indicates a quantized time delay $\Delta t_r$ from the rising edge (i.e. the significant edge wherein the significant edge may also be the falling edge) of the DCO clock CKV to the FREF sampling edge. Similarly, the position of the detected transition from 0 to 1 indicates a quantized time delay $\Delta t_f$ from the falling edge of the DCO clock CKV to the FREF sampling edge. In this example, the pseudo thermometer code edge detector is operative to output a $\Delta t_R$ signal 208 (FIG. 10) having a value of 6. The pseudo thermometer code edge detector also outputs a $\Delta t_F$ signal 210. The $\Delta t_R$ signal represents the difference between the rising edge of FREF and the previous rising edge of CKV expressed in multiples of $t_{inv}$, the time delay of an inverter. The $\Delta t_F$ signal represents the difference between the rising edge of FREF and the previous falling edge of CKV. The $\Delta t_R$ value is subsequently normalized and used by the phase detector to correct the tuning word input to the DCO. The normalization circuit 212 comprises a period averager 214, inverse function 216 and multiplier 218. The output of the TDC is normalized by the DCO clock period $T_V$ before it is input to the PLL loop. Note that it has been found that accumulating 128 clock cycles by the averager is sufficient to produce an accuracy within 1 ps of the inverter delay $t_{inv}$.

The combination of the arithmetic phase detector and the TDC can be considered a replacement of a conventional phase/frequency detector. Since all the circuitry in the ADPLL system uses the delayed, retimed version CKR of the FREF clock except for the TDC and the clock retiming circuitry, which uses the original FREF clock, there will be a quiet time period during the TDC sampling period. The ADPLL thus exploits a time-causal relationship between the FREF and CKR clocks. The critical continuous-domain time-difference conversion to a digital word by the TDC is performed at the FREF edge event. The FREF clock is then resampled (i.e. retimed) by the CKV clock edges to generate the CKR clock. The digital processing of almost the entire chip, including the ADPLL, is performed at the following CKR edge event or synchronously with the other CKV events.

Thus, the digital logic circuitry on the chip is forced to be quiet at the time the FREF edge event arrives. Once the time difference has been measured by the TDC, the tens or hundreds of thousands of gates of digital circuitry can operate with the consequent noise generation from ringing, etc.

TDC Quantization Noise

The FREF retiming quantization error is determined by the time to digital converter (TDC). As shown in FIG. 10, the TDC is constructed as an array of inverters and registers and functions to measure the fractional delay difference between the reference clock and the next rising edge of the oscillator clock. The resolution of this delay difference is a single inverter delay $\Delta t_{inv}$ which typically can be considered the most stable regenerative logic level delay and is on the order of 20 ps depending on the particular process. Such an inverter delay results in a GSM quality phase detection mechanism.

The TDC operates by passing the oscillator clock (CKV) through the chain of inverters wherein the delayed clock is then sampled by the FREF clock using an array of registers whose outputs form a pseudo-thermometer code. The TDC output is normalized by the oscillator clock period $T_V$ before being input to the phase locked loop.

In principle, the TDC operation results in quantizing the phase (or time) difference between FREF and the nearest causal CKV clock edge at specific time instances. This specific time instance is the rising edge of FREF clock in the case of an ADPLL.

The TDC quantization operation, however, has an effect on the phase noise at the output of the ADPLL. Considering the phase noise spectrum contributors at the RF output of the ADPLL reveals that the TDC phase noise contribution can be minimized by improving the TDC timing resolution and increasing the sampling rate.

There are two potential internal sources of noise: the first is the oscillator itself and the second is the TDC operation of calculating $\epsilon$ (epsilon), i.e. the normalized timing delay difference. It is noted that other than these two sources of internal phase noise, the system, due to its digital nature, is relatively immune from any time-domain or amplitude-domain perturbations and does not contribute to the phase noise.

The phase noise generated by the operation of the TDC is due to the fact that even though the TDC is a digital circuit, the FREF and CKV clock edge information is continuous in the time domain. The TDC error comprises several components including quantization errors, non-linearity errors and random errors due to thermal effects. The TDC quantization noise, however, is the predominant of the three components. The TDC phase error is particularly worse (i.e. spikes) when are caused by ill-conditioned TDC behavior at integer-N values of the channel number.

Figure 12:
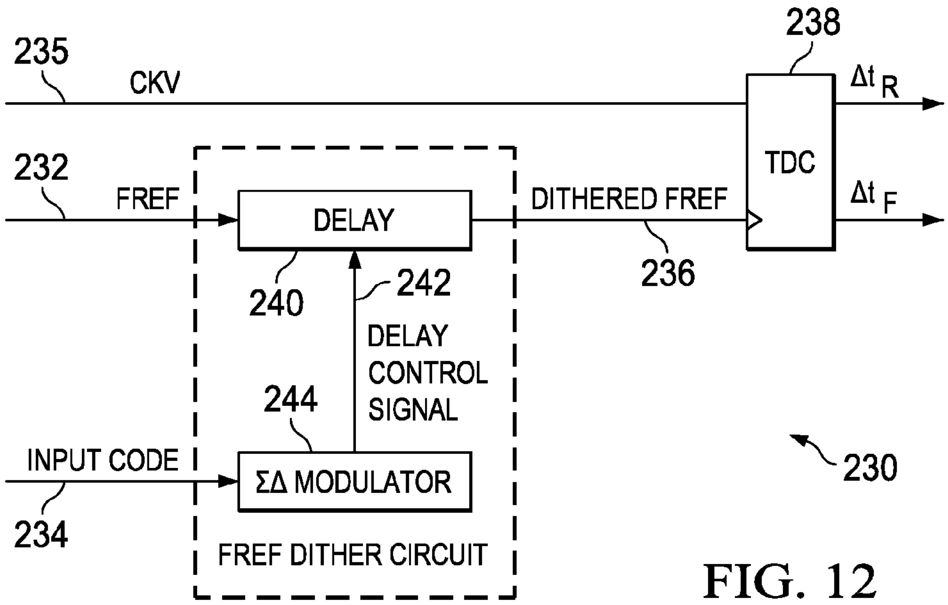
FIG. 12 is a block diagram illustrating an example FREF dither circuit.

A solution to this problem is to randomize the instantaneous value of the timing difference using well-known sigma-delta modulation techniques such that the reference clock FREF is dithered before being input to the TDC. A block diagram illustrating an example FREF dither circuit is shown in FIG. 12. The FREF dither circuit, generally referenced 230, comprises a delay circuit 240 and a $\Sigma\Delta$ (sigma-delta) MASH modulator 244. The FREF clock 232 is input to the delay circuit which is operative to output a dithered version 236 of the FREF clock. The delay circuit applies a delay to the FREF signal in accordance with a delay control signal 242 generated by the sigma-delta modulator. An input code 234 determines the amount of dithering to be applied to the FREF signal.

Note that the sigma-delta modulator may be any order depending on the requirements of the particular application. In the example presented herein, the modulator is a $5^{th}$ order sigma-delta MASH modulator. A constant input code to the sigma-delta modulator results in a high-speed unit weighted 32-bit output whose time-averaged value equals that of the input. The power spectral density of the output is noise shaped with the quantization energy rising at higher frequencies.

Figure 13:
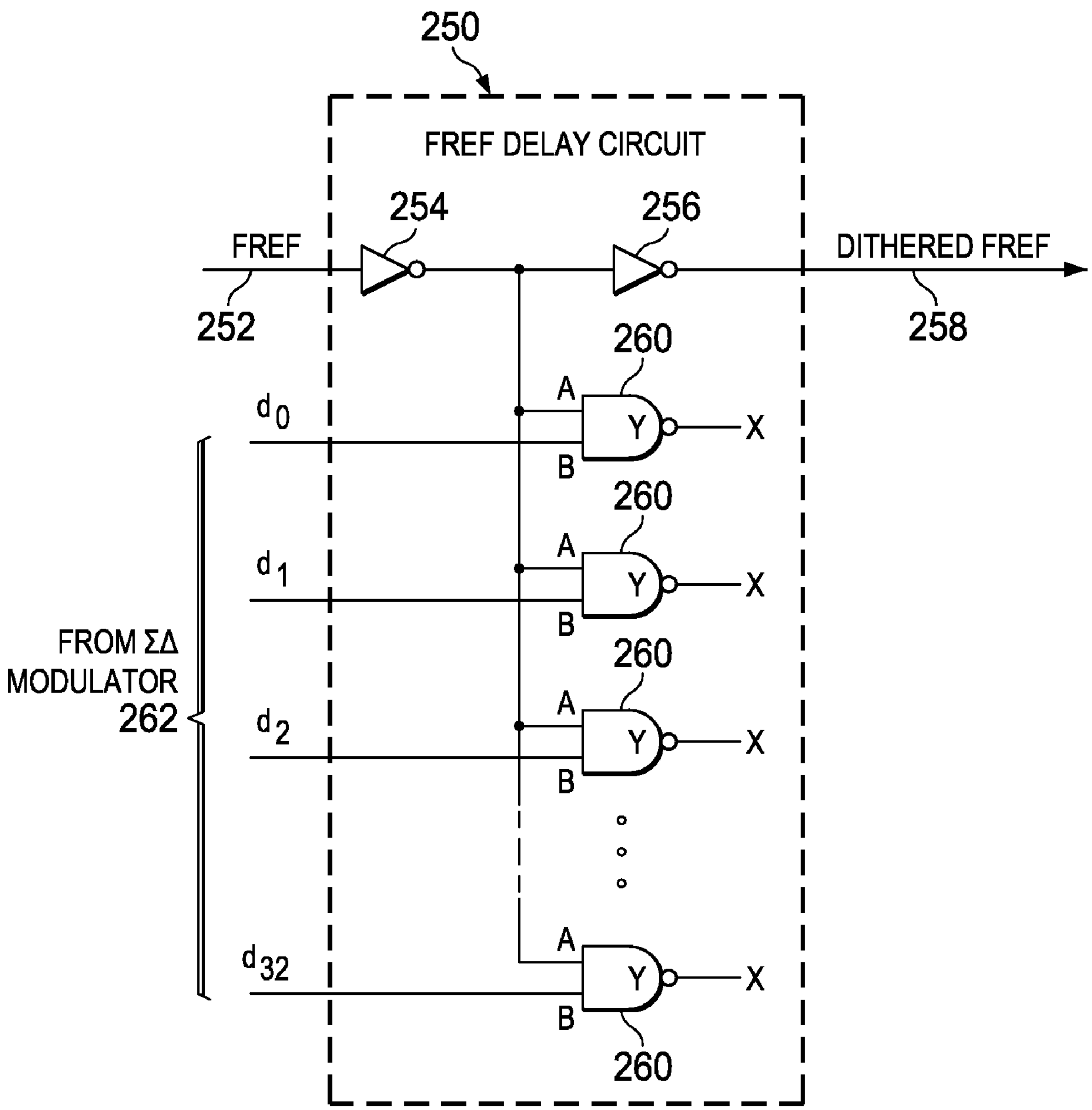
FIG. 13 is a block diagram illustrating the example FREF delay circuit portion of the dither circuit of FIG. 12 in more detail.

A block diagram illustrating one realization of the FREF delay circuit portion of the dither circuit of FIG. 12 in more detail is shown in FIG. 13. The delay circuit 250 comprises inverters 254, 256 and a plurality of gates 260. In this $5^{th}$ order example, there are 32 NAND gates, each NAND gate having A and B inputs and a Y output. The 32-bit sigma-delta modulator delay control output functions to control the delay of the FREF clock signal by changing the cumulative capacitance of the A-input of each of the 32 NAND gates by virtue of the state of their B-input. The Y outputs are left unconnected. Note that the static delay generated by the delay circuit does not impact performance since the ADPLL is operative to correct for it automatically.

Figure 4:
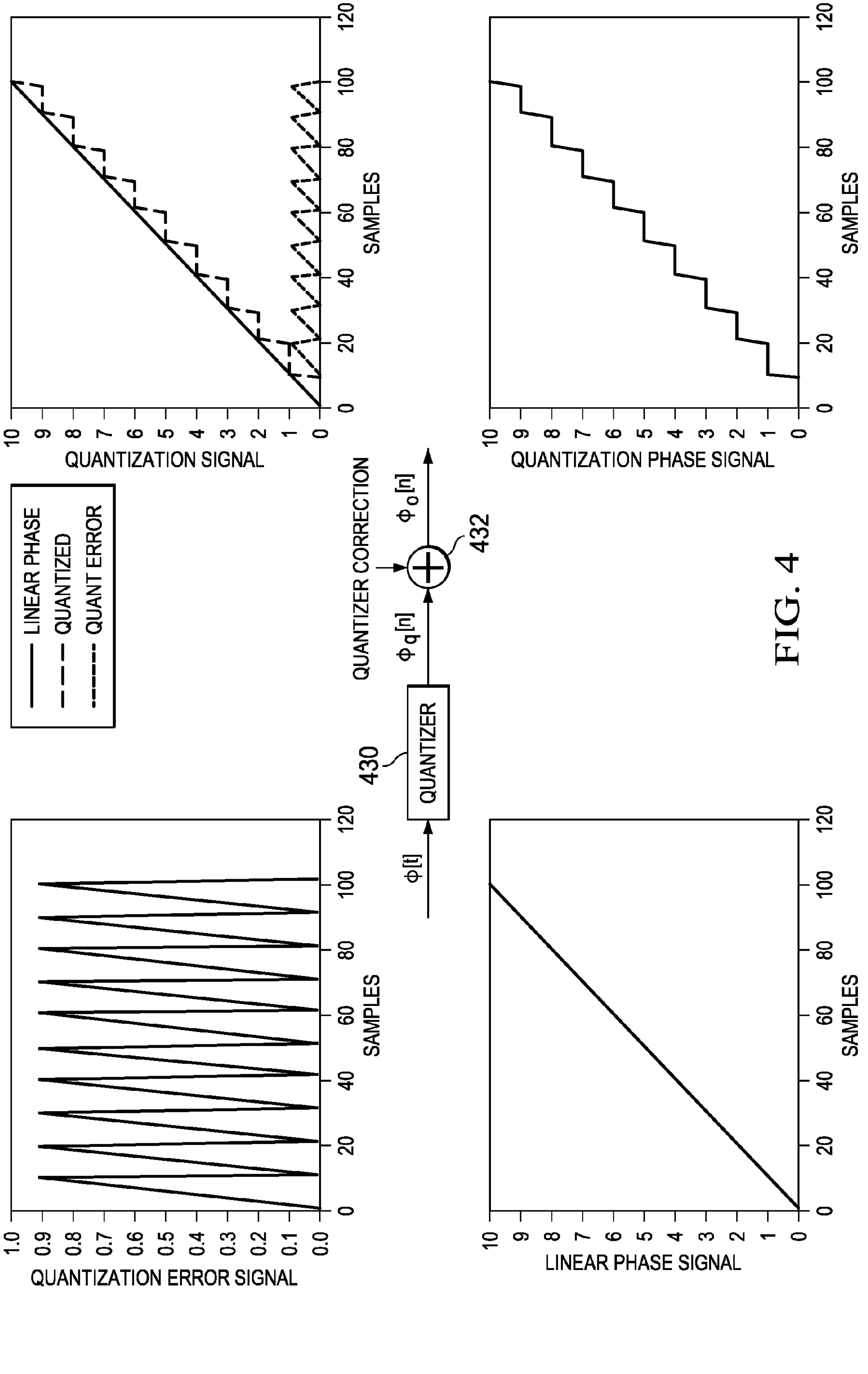
FIG. 4 is a diagram illustrating the quantization of a linear phase-domain ramp signal.

For a better understanding of the effect of TDC quantization, consider quantizing a linear phase signal with a uniform quantizer in an open-loop system. A diagram illustrating the quantization of a linear phase signal is shown in FIG. 4. A correction signal is added (via adder 432) to the output of the quantizer 430. Graphs of the linear phase signal, quantized phase signal, quantization error signal and the final quantized signal are shown. In this case, the quantization error correction signal is a saw-tooth signal. The goal is to improve the low frequency quantization noise by adaptively adding a correction signal to the quantized signal. The quantization noise problem is further complicated in a closed loop digital PLL system. The present invention provides a signal processing algorithm, which functions to perform noise shaping on this quantization noise that pushes the quantization noise energy outside the PLL loop bandwidth.

Figure 5:
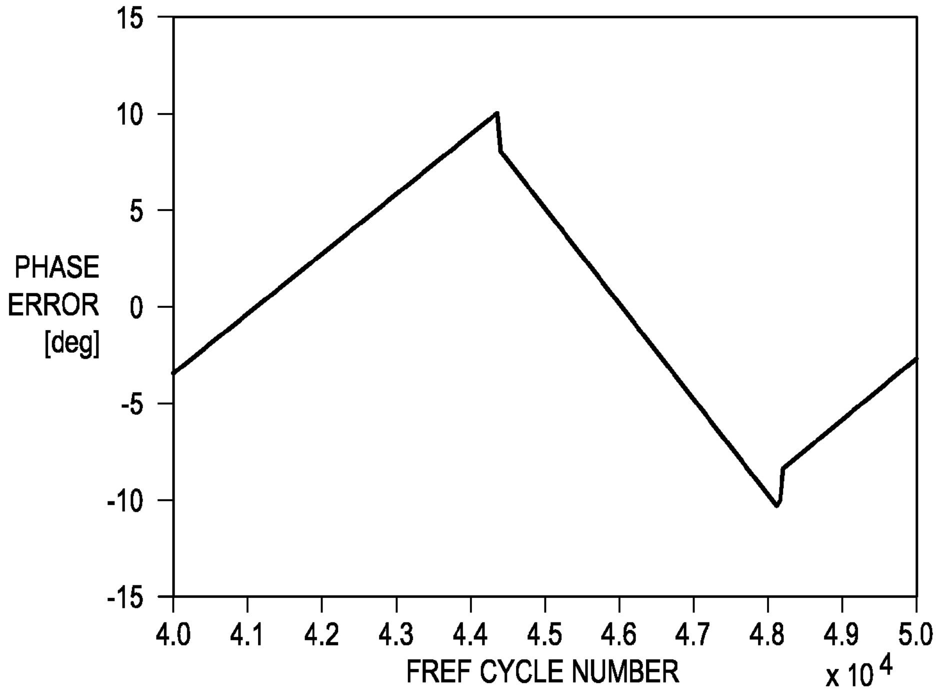
FIG. 5 is a graph illustrating the phase error trajectory for an initial state resulting in poor RMS phase error.

As mentioned earlier, the nonlinear effect of the quantizer in a feedback system introduces limit cycles. The following examples demonstrate this effect in an example ADPLL system. The RMS phase error (or the phase error trajectory) for an integer channel depends on the initial state and the noise in the digital PLL system. A graph illustrating the phase error trajectory for an initial state resulting in a poor RMS phase error is shown in FIG. 5. Note that in this example, the fequency of the CKV clock is 1872 MHz, FREF=26 MHz, $T_{inv}$=30 ps with negligible other noise sources in the digital PLL.

Figure 6:
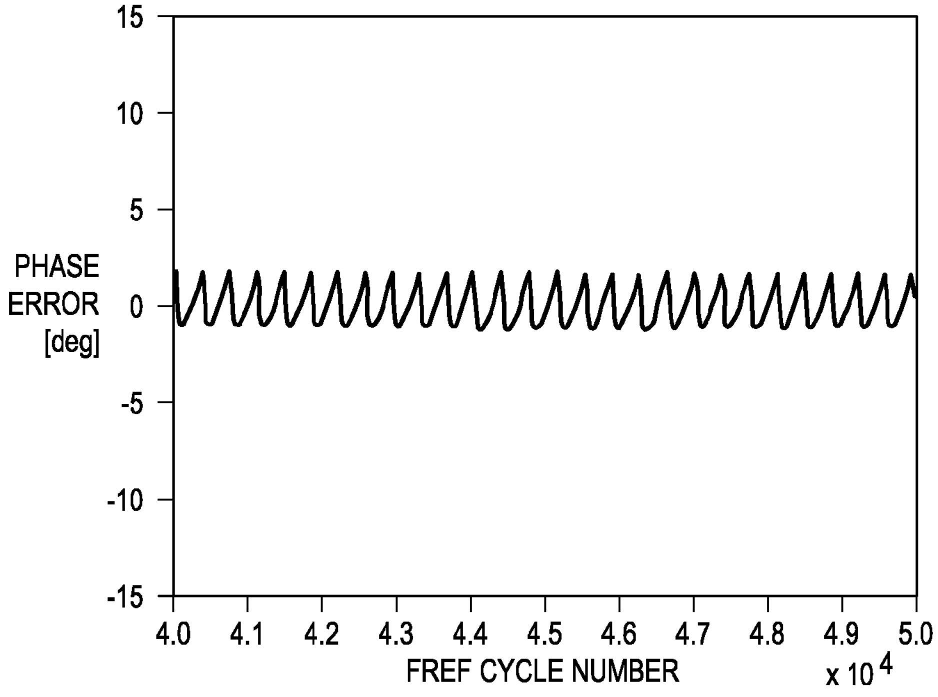
FIG. 6 is a graph illustrating the phase error trajectory for an initial state resulting in good RMS phase error.

At the same time, for a different state the phase error trajectory may look much better as shown in FIG. 6, which shows the phase error trajectory for an initial state resulting in good RMS phase error. The cyclic pattern of the phase error is a phenomenon called limit cycle in nonlinear control theory. In this example, the frequency of the CKV clock is 1872 MHz, $T_{inv}$=30 ps with other noise sources made negligible in the digital PLL.

Figure 7:
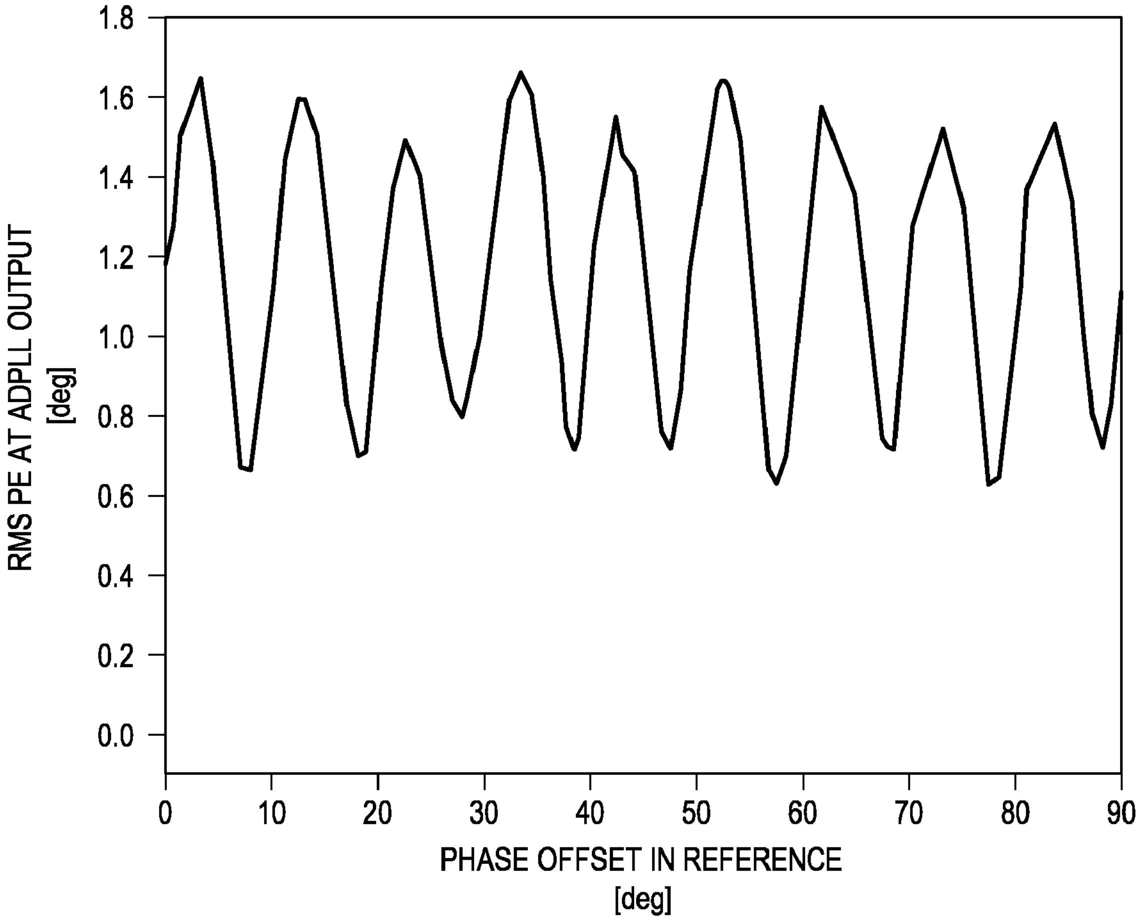
FIG. 7 is a graph illustrating the RMS phase error dependence on the initial phase of the CKV clock at the output of the digital PLL.

The variation of the RMS phase error measurement as the initial CKV clock phase is varied is shown in FIG. 7. In particular, the graph illustrates the RMS phase error versus the initial phase of the CKV clock at the output of the digital PLL. In this example, the frequency of the CKV clock is 1872 MHz, $T_{inv}$=20 ps with negligible noise sources in the digital PLL.

Generalized Adaptive Quantization Noise Shaping Mechanism

The time-to-digital converter in the broad sense defines a mechanism by which the difference (e.g., timing difference) between two analog quantities (e.g., the difference between the respective edge timestamps of reference and DCO clocks) is quantized. The term feedback control system refers to any such loop that inherently introduces such analog-to-digital quantization in the feedback or sensory paths of the loop. Such arrangements are often employed in control systems where synchronization is achieved between a reference and a control signal. Examples of such feedback control systems include symbol timing recovery loops, clock synchronization between, for example, base station and a mobile device, baseband and the transceiver, etc.

Figure 14:
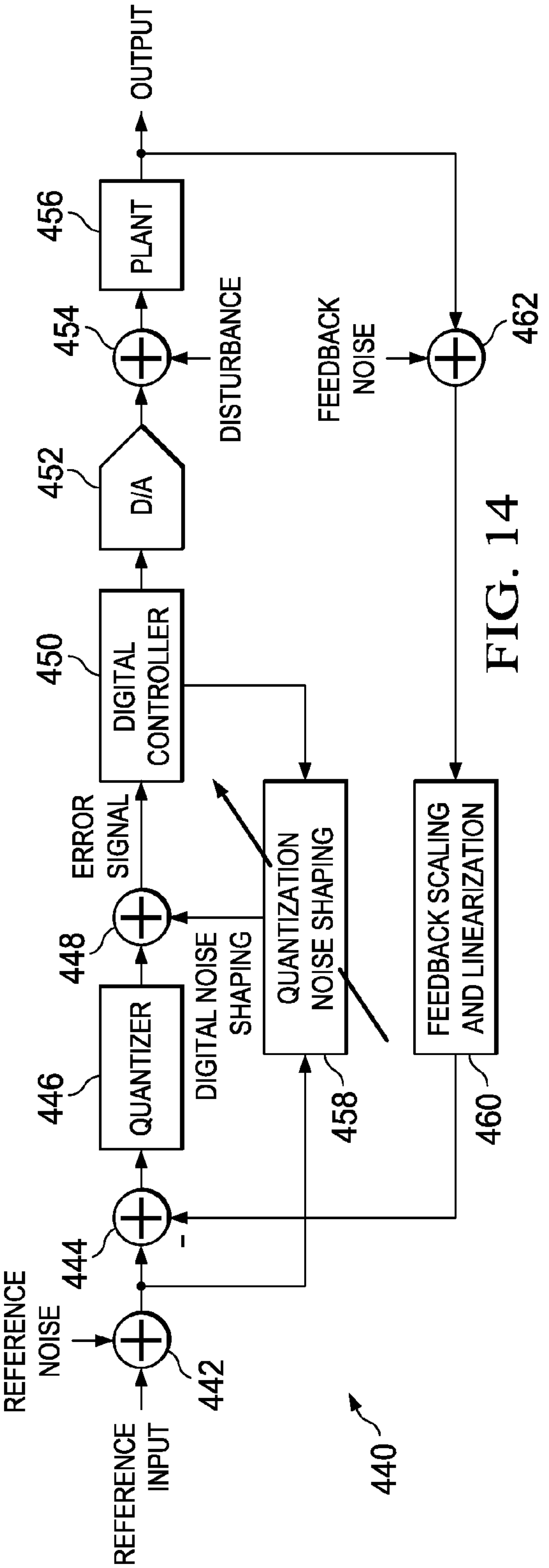
FIG. 14 is a block diagram illustrating an example digital controller circuit incorporating the quantization noise shaping mechanism of the present invention and utilizing digital noise shaping.

A block diagram illustrating an example digital controller circuit incorporating the quantization noise shaping mechanism of the present invention and utilizing analog noise shaping is shown in FIG. 14. The control circuit, generally referenced 440, comprises adders 442, 444, 448, 454, 462, quantizer 446, digital controller 450, digital to analog converter (DAC) 452, quantization noise shaping block 458, feedback scaling and linearization block 460 to appropriately scale the plant output as well linearize any nonlinearity in the plant and the physical plant 456 (e.g., analog devices such as motors, actuators, in the ADPLL example this is the DCO etc.). In this case the plant can be both a linear or a nonlinear system. Note that adders 442, 454 and 462 are conceptual only for showing additive noise sources.

In this first generalized embodiment, digital noise shaping is applied after the quantization step. The quantization noise shaping block uses the reference input with noise added and data from the digital controller to generate the digital noise shaping. In the particular example of the ADPLL, the reference signal is the frequency command word (FCW). The quantizer functions to quantize the error between the desired FCW and the instantaneous frequency deviation of the PLL output normalized with respect to the reference frequency. The sampling rate of the quantizer in this case is the reference clock rate. The quantization noise shaping block generates the quantization correction signal utilizing the reference input (i.e. the desired frequency command word) and observable signals from the controller (e.g., example DCO correction signal, actual quantized output, etc.)

Figure 15:
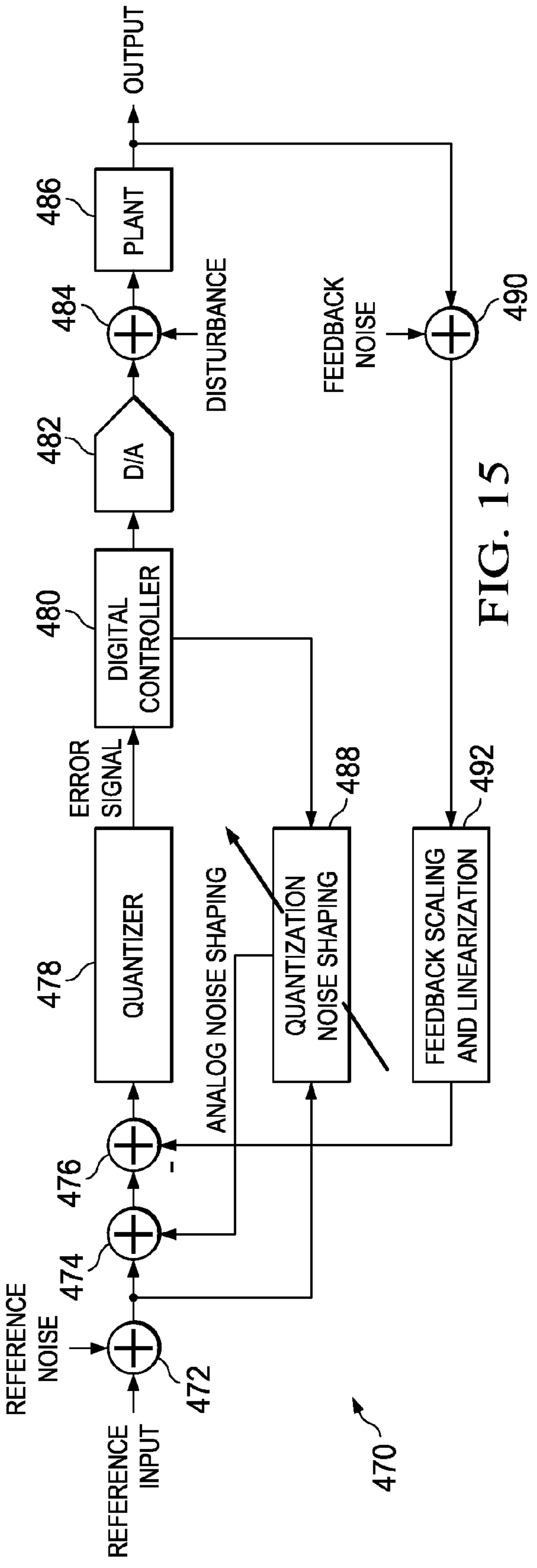
FIG. 15 is a block diagram illustrating an example digital controller circuit incorporating the quantization noise shaping mechanism of the present invention and utilizing analog noise shaping.

A second generalized block diagram illustrating the TDC resolution improvement mechanism of the present invention is shown in FIG. 15. The control circuit, generally referenced 470, comprises adders 472, 474, 476, 484, 462, quantizer 478, digital controller 480, digital to analog converter (DAC) 482, quantization noise shaping block 488, feedback scaling and linearization block 492 and the physical plant 486 (e.g., analog devices such as motors, actuators, etc.). Note that adders 472, 484 and 462 are conceptual only for showing additive noise sources.

In this second generalized embodiment, the noise shaping provided by the quantiziation noise shaping block is analog (rather than digital as was in the first generalized embodiment of FIG. 14) and is added to the reference input before the quantizer 478 via adder 474. The operation of the second generalized embodiment is similar to that of the first with the exception of the analog noise shaping.

TDC Quantization Noise Shaping Mechanism

Figure 16:
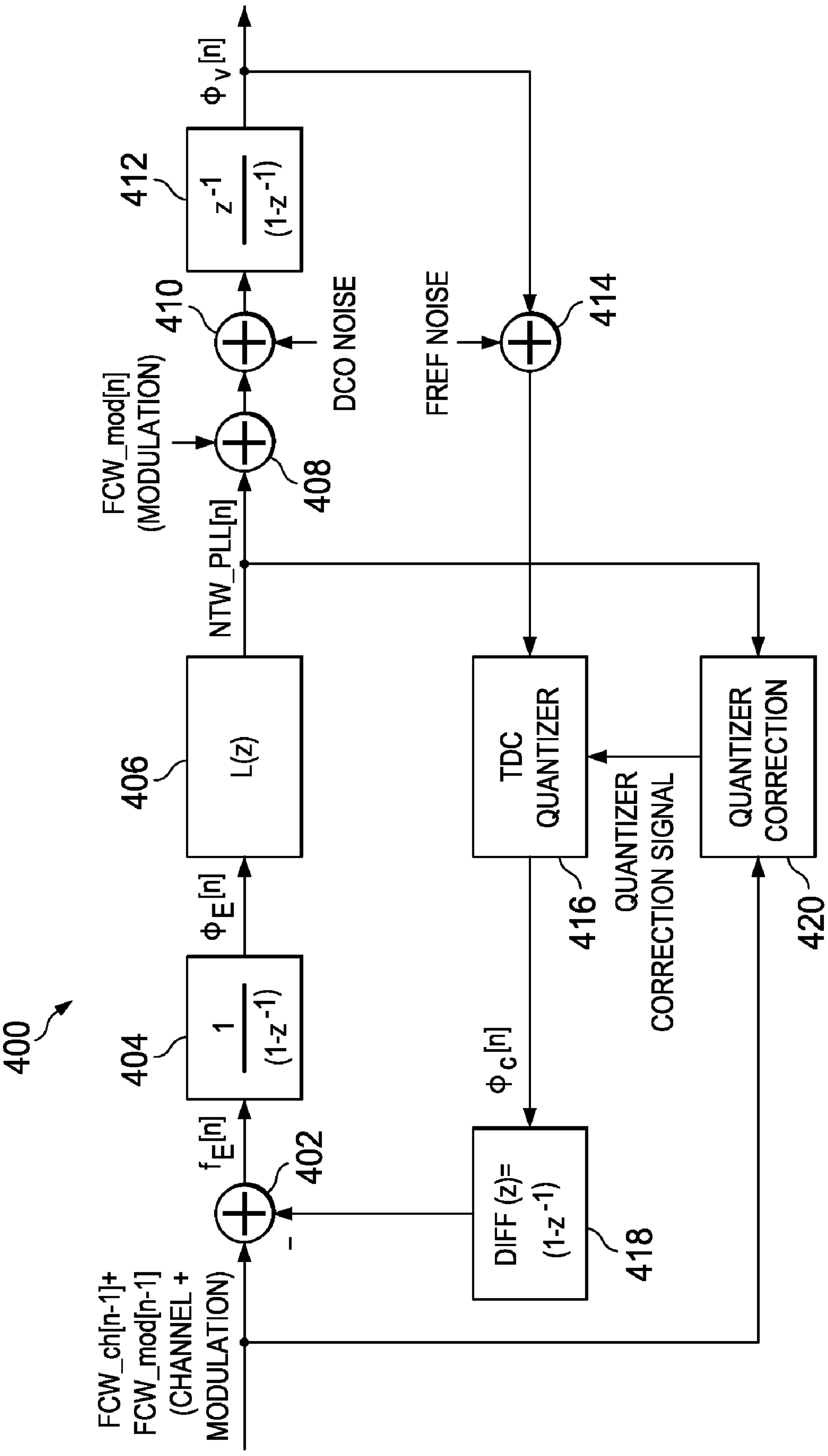
FIG. 16 is a generalized block diagram illustrating the TDC resolution improvement mechanism of the present invention.

As stated supra, the objective of the present invention is to improve TDC quantization noise for both integer and non-integer channels thereby improving the overall RMS phase error. A generalized block diagram illustrating the TDC resolution improvement mechanism of the present invention is shown in FIG. 16. The circuit, generally referenced 400, comprises frequency detector 402, integrator 404 to convert frequency error to phase error, low pass loop filter 406, adder 408 for injecting modulation, conceptual adder 410 for introducing DCO noise, normalized DCO 412, conceptual adder 414 for injecting FREF noise and reference delay, differentiation block 418 and quantizer correction block 420.

In one embodiment, an implementation of the quantizer correction block is operative to estimate the CKV clock edges at each FREF cycle and control the spectral shape of the quantization noise. The TDC quantization noise can be shaped by observing the TDC output and applying appropriate delay control signals (e.g., dither) to delay the reference clock (FREF of 26 MHz) such that the TDC quantization noise is shaped.

The noise shaping applied can take many forms. Several examples of preferred noise shaping are listed below:

1. First ($1^{st}$) order sigma-delta noise shaping or higher order sigma-delta noise shaping.
2. Concentrating the quantization noise in particular frequency bins that are subsequently filtered out. The quantization noise can be shaped to comprise a short pattern, such as an alternating inverter delay pattern. Note that type of noise shaping is very desirable as the ADPLL loop filter (e.g., $4^{th}$ order IIR filter) provides very good rejection at high frequencies.
3. Any noise shaping chosen can be further enhanced by applying the TDC operation on both the rising and falling edges of the reference clock. This is equivalent to doubling the reference clock.

The motivation behind the proposed mechanism is derived from the observation that the relative phase (or time delay) of the CKV clock with respect to TDC reference clock (i.e. the delay controlled FREF clock) can affect the quantization noise from the TDC quantizer.

To illustrate this, consider an open loop simulation of the TDC. The input to the TDC quantizer is a $5^{th}$ order ΣΔ generated pseudo-random delay with varying delay offsets. The unit delay of ΣΔ output is also varied as a fraction of the TDC quantization resolution (i.e. inverter delay $T_{inv}$). To measure the sensitivity of the TDC quantizer, the TDC output is correlated with the input delay sequences. This yields a good indication of the accuracy of the TDC output.

Figure 17:
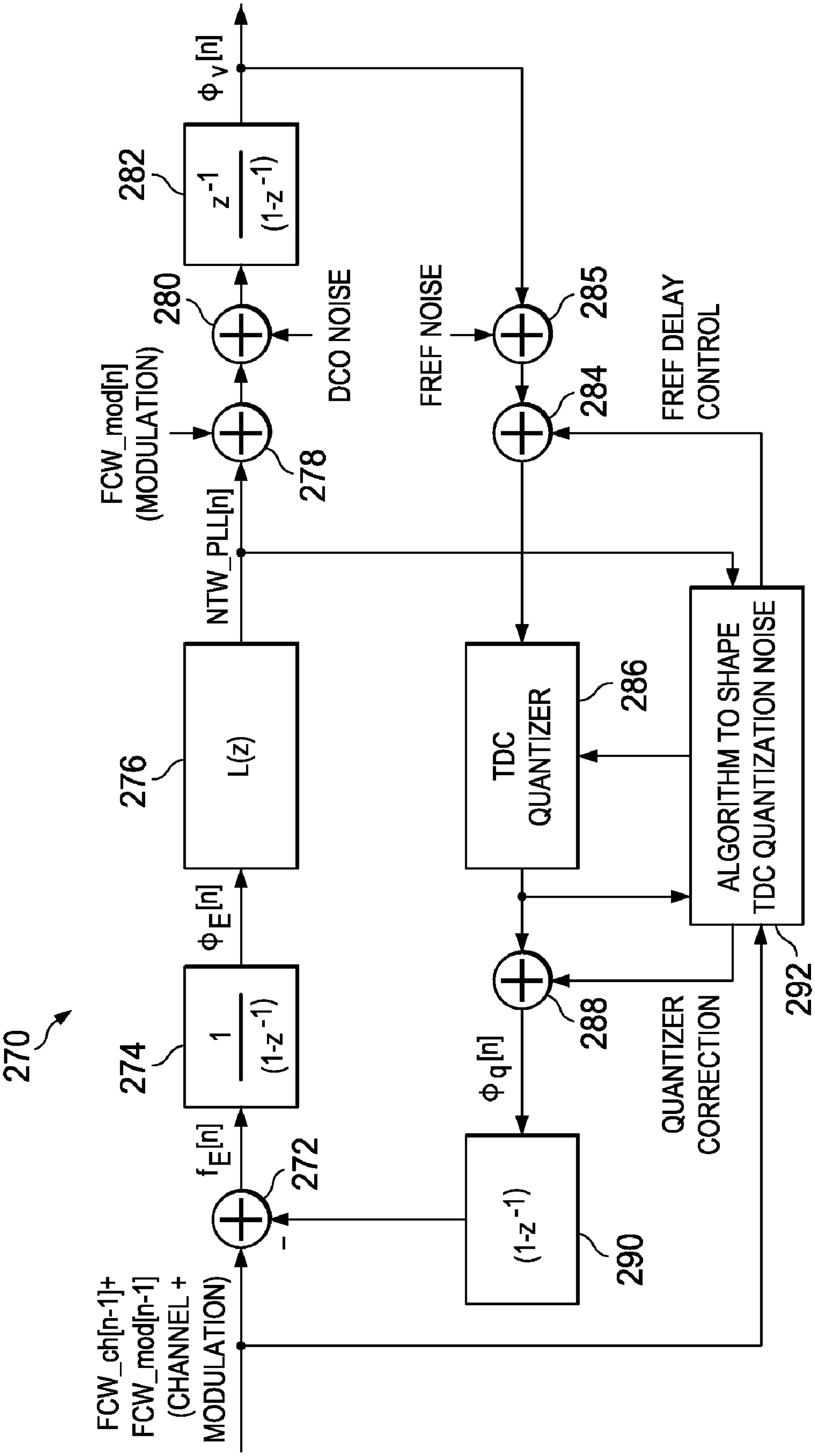
FIG. 17 is a block diagram illustrating an example implementation of the TDC quantization noise shaping mechanism of the present invention in an ADPLL loop.

.A block diagram illustrating an example implementation of the TDC quantization noise shaping mechanism of the present invention in an ADPLL loop is shown in FIG. 17. The circuit, generally referenced 270, comprises frequency detector 272, integrator 274 to convert frequency error to phase error, low pass loop filter 276 adders 278, 280 for injecting modulation and DCO noise, respectively, normalized DCO 282, adder 284 for injecting reference delay, conceptual adder 285 for injecting FREF noise, adder 288 for adding the DCO correction term, differentiation block 290 and TDC quantization noise shaping block 292. Note that the adders 280 and 285 are conceptual only for showing additive noise sources.

It is noted that in case of ADPLL, the present invention does not require any significant additional hardware to implement the quantization noise shaping mechanism. In the example embodiment presented herein, the mechanism uses the dithering NAND gates (or other possible ADPLL dithering implementations) and existing structure of the TDC circuit to implement the TDC resolution enhancement mechanism. The only additional cost being the computation of the adaptive dither correction that may be either realized as dedicated hardware or more conveniently as firmware operating on the internal script processor 146 (FIG. 8).

In accordance with the mechanism, the frequency reference clock FREF is delayed utilizing NAND gates as shown in FIGS. 12 and 13. The invention, however, generates the NAND gate delays in an adaptive manner such that the overall TDC quantization noise is shaped. The TDC circuit structure does not require modification. Note that the frequency reference clock FREF may comprise a fixed frequency clock provided either using an on-chip or external interface.

Figure 18:
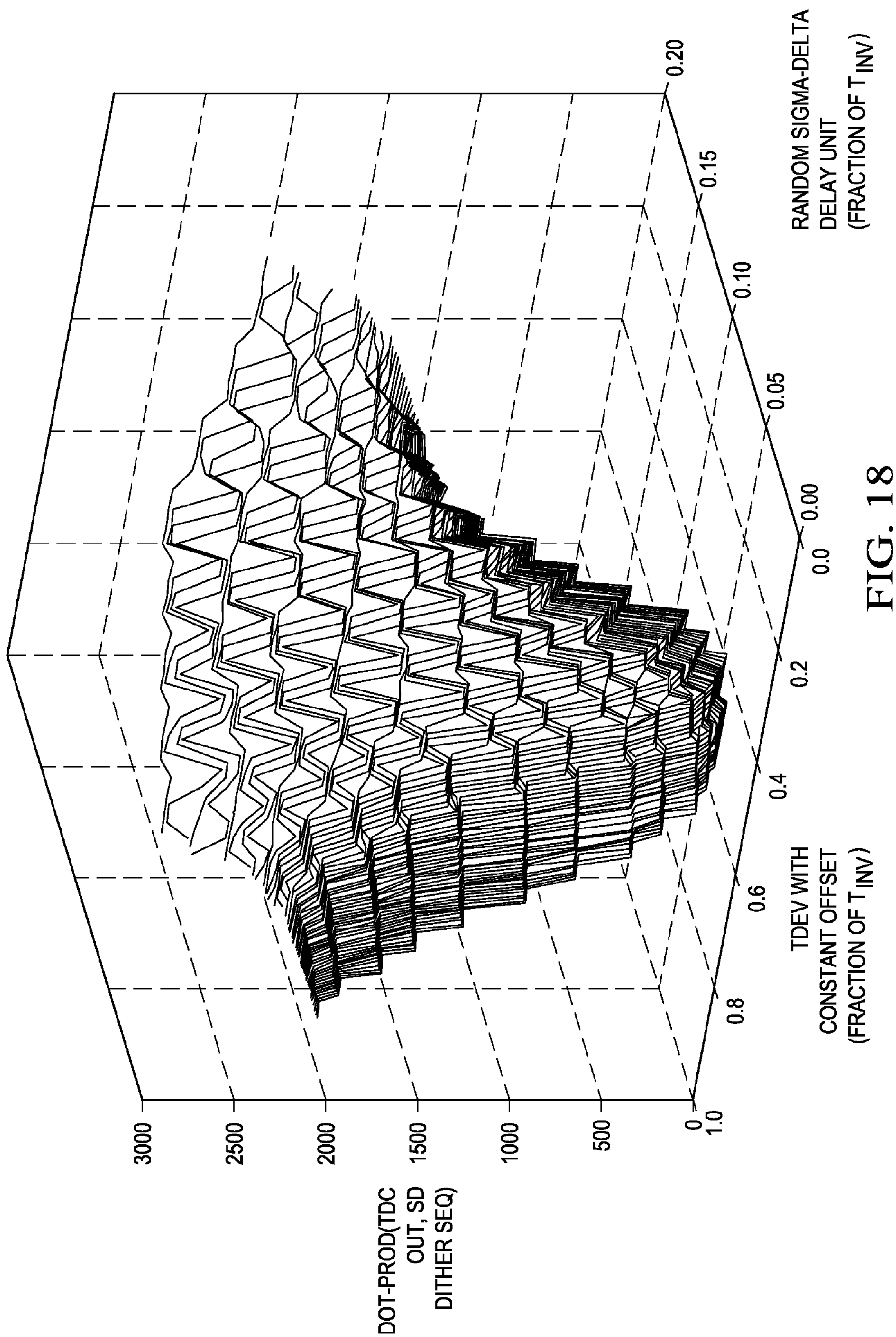
FIG. 18 is a graph illustrating the sensitivity of the TDC for different delay offsets at the input to the TDC.

A graph illustrating the sensitivity of the TDC for different delay offsets at the input to the TDC is shown in FIG. 18. The random sigma-delta unit delay is varied to demonstrate that the inverter boundary points are more sensitive to variations in TDC input. The graph shows that the correlation output is much stronger when the DC offset of the pseudo-random delay sequence is near the boundaries of the inverter delays. Intuitively it can be seen that small changes in delay near an inverter boundary will more readily have an effect on the TDC quantizer output. Whereas a much larger delay variation is needed to change the TDC output when the delay offset is in the middle of an inverter delay boundary. Therefore, the TDC quantizer resolution can be enhanced by controlling the injection of additional delay offset to the FREF clock so that the TDC always operates near an inverter boundary. Note that the quantization noise in this case will be white-like. This result, however, is still superior than limit cycles or low frequency dominant quantization noise, which is possible for digital PLL type nonlinear systems due to undesirable initial conditions. A still better solution is to high pass shape the quantization noise.

Figure 19:
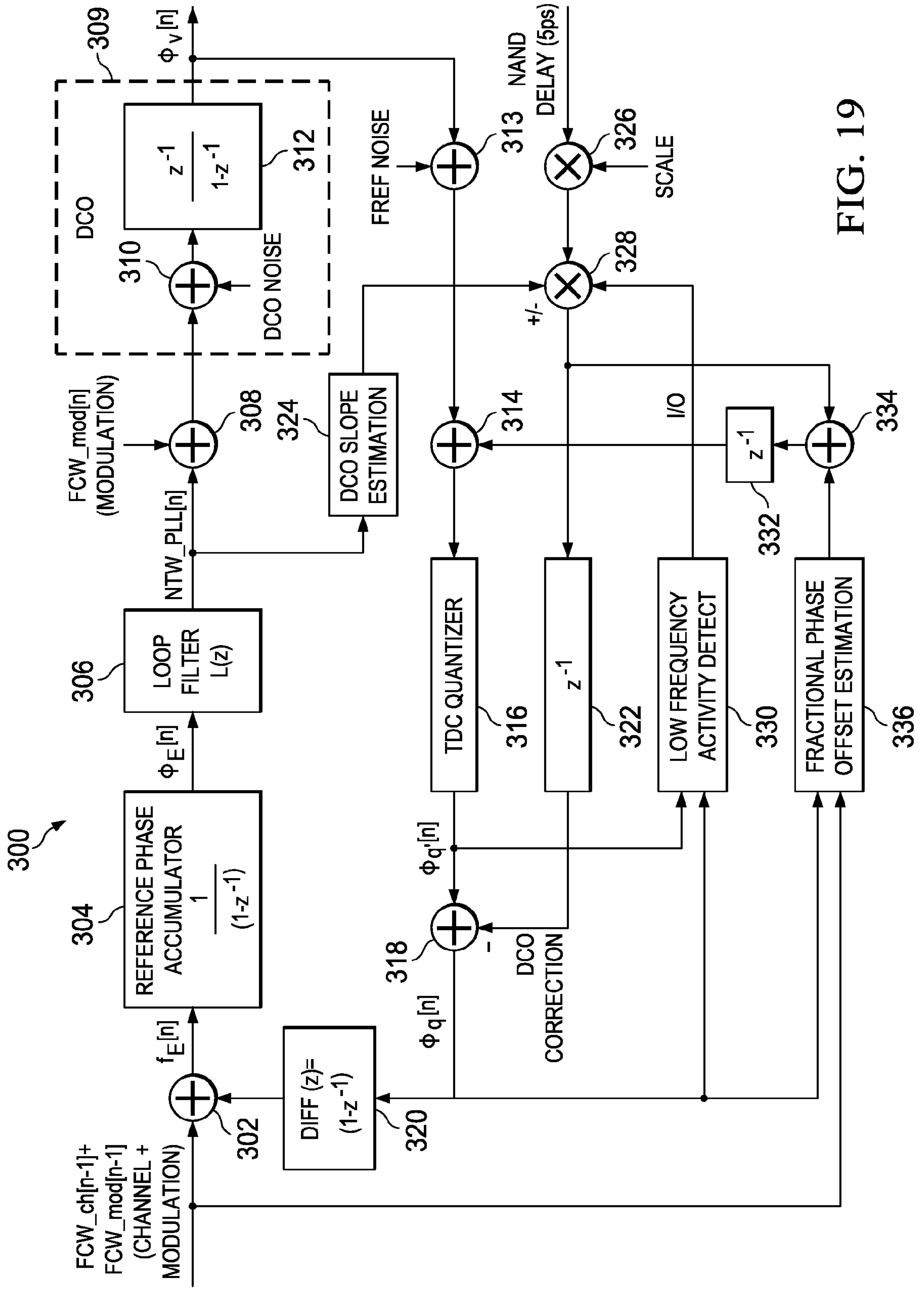
FIG. 19 is a block diagram illustrating the TDC quantization noise shaping mechanism of FIG. 17 in more detail.

A block diagram illustrating the TDC quantization noise shaping mechanism of FIG. 17 in more detail is shown in FIG. 19. The example circuit, generally referenced 300, comprises frequency detector 302, integrator 304 to convert frequency error to phase error, low pass loop filter 306 adders 308, 310 (conceptual only) for injecting modulation and DCO noise, respectively, normalized DCO 312, conceptual adder 313 for injecting FREF noise and adder 314 for injecting reference delay, adder 318 for adding the DCO correction term to the output of the TDC, differentiation block 320, TDC quantization block 316, DCO slope estimation block 324, delays 322, 332, low frequency activity detect block 330, fractional phase offset estimation 336, adder 334 and scaling multipliers 326, 328. Note that all logic is clocked in the FREF domain.

Note that for illustration purposes only, the invention depicts a realization of the TDC circuit as shown in FIG. 10 using inverter delays and an example realization of the FREF dithering element delay in FIGS. 12 and 13 using NAND gates. It is appreciated that other realizations of the TDC circuit are possible and contemplated by the present invention. Realization examples of the dithering delay element include gate propagation delays or analog implementations.

In accordance with the invention, the reference clock is delayed with NAND gates as shown in FIGS. 12 and 13. The NAND gate delays, however, are generated in an adaptive manner such that the overall TDC quantization noise is shaped. The TDC structure does not need to be modified. In particular, the TDC quantization noise is shaped by observing the TDC output and applying an appropriate dither (i.e. sequence) to offset the frequency reference clock edges (i.e. normally 26 MHz) such that the TDC quantization noise is shaped. The delay (or dither) of the frequency reference clock is applied with significantly finer resolution (i.e. NAND gates having ~5 ps delay) than the resolution of the TDC inverter delay (i.e. ~20 ps).

The circuit 300 is operative to shape the quantization noise as follows. The mechanism attempts to place the CKV clock (output of the ADPLL) at the boundary of the delayed (i.e. dithered) reference clock, thereby operating the TDC circuit 316 at its most sensitive delay point. The CKV clock edge can be estimated from the previous estimate of the CKV clock and the current Frequency Command Word (FCW) including channel and modulation. When there is no activity in the TDC, it means there are no changes in edge timing and the TDC is not operating in its sensitive point, i.e. the TDC is not tracking the CKV (RF oscillator) clock edge. The mechanism moves the FREF edge (earlier or later) to place the TDC as close as possible to its sensitive operating point. The slope of the normalized tuning word (NTW) is used to determine whether to speed up or retard the FREF clock.

The dithering applied to the reference clock edge is generated as follows. The fraction of estimated CKV clock edge is determined in terms of NAND gate delay or it could be realized through some other means. Further, if the TDC output is low frequency in nature (i.e. the TDC quantization noise is of low frequency) then high frequency TDC noise is induced by adding dithering in a direction opposite that of the DCO drift. The slope of the DCO drift is estimated from the slope of the normalized tuning word (NTW) NTW_PLL signal of the ADPLL.

Figure 20:
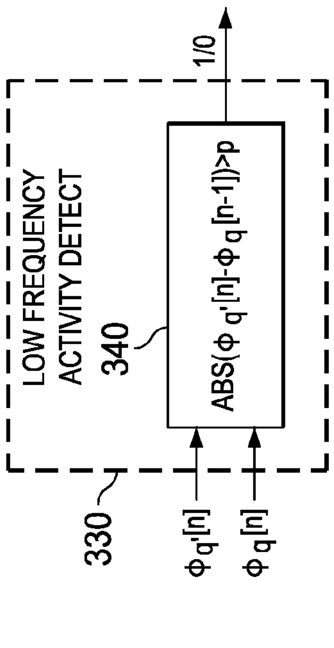
FIG. 20 is a block diagram illustrating an example of the low frequency activity detect mechanism of the present invention.

An example block diagram illustrating the low frequency activity detect mechanism of the present invention is shown in FIG. 20. The detector, generally referenced 330, comprises calculation block 340 which is operative to calculate the following:

$$ABS(\phi_{q'}[n]-\phi_q[n-1])>\rho \qquad (7)$$

where

ρ is the threshold (e g., $T_{INV}/T_V/4$);

$T_{INV}$ is the inverter delay (i.e. raw TDC resolution);

$T_V$ is the ADPLL frequency period;

Note that the low activity phenomena in the ADPLL output are contributed by the drift in the DCO frequency, temperature and other parametric ambient changes around the transmitter.

In operation, the low frequency activity detector examines the differences between sample output of the TDC circuit, i.e. it differentiates the output). It detects whether or not the TDC output contains high frequency content. This is an indication that the TDC quantization noise is high frequency noise shaped. The output of the circuit 330 is an enable signal '1' or a disable signal '0' to indicate whether the TDC is active enough or not. The dither is applied only if the enable signal is active. A high rate of change indicates the TDC is active. Conversely, a low rate of change indicates the TDC is inactive. In the latter case, this means that some amount of delay needs to be added to the reference clock.

Figure 21:
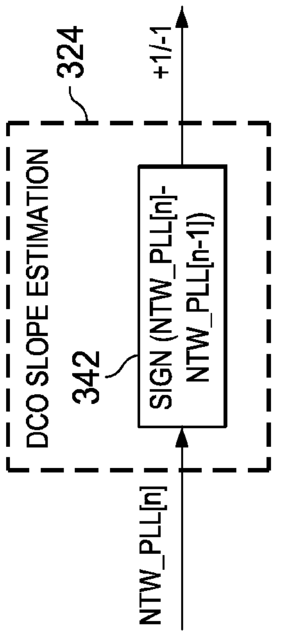
FIG. 21 is a block diagram illustrating an example of the DCO slope estimation mechanism of the present invention.

An example block diagram illustrating the DCO slope estimation mechanism of the present invention is shown in FIG. 21. The DCO slope estimation circuit, generally referenced 324, comprises calculation block 342 which is operative to calculate the following:

$$\text{SIGN(NTW\_PLL[n]-NTW\_PLL[n-1])} \quad (8)$$

In operation, the block 342 estimates the negative slope of the DCO drift. It is thus determined whether the DCO drift is increasing or decreasing. The output from this block is an indication of either positive or negative slope (i.e. +1/−1) or no change. The output value represents the direction the reference delay is to be applied. The high frequency content is contributed by the instantaneous phase errors due to quantization, the digital nature of the loop, phase/frequency modulation of the ADPLL clock, etc.

Figure 22:
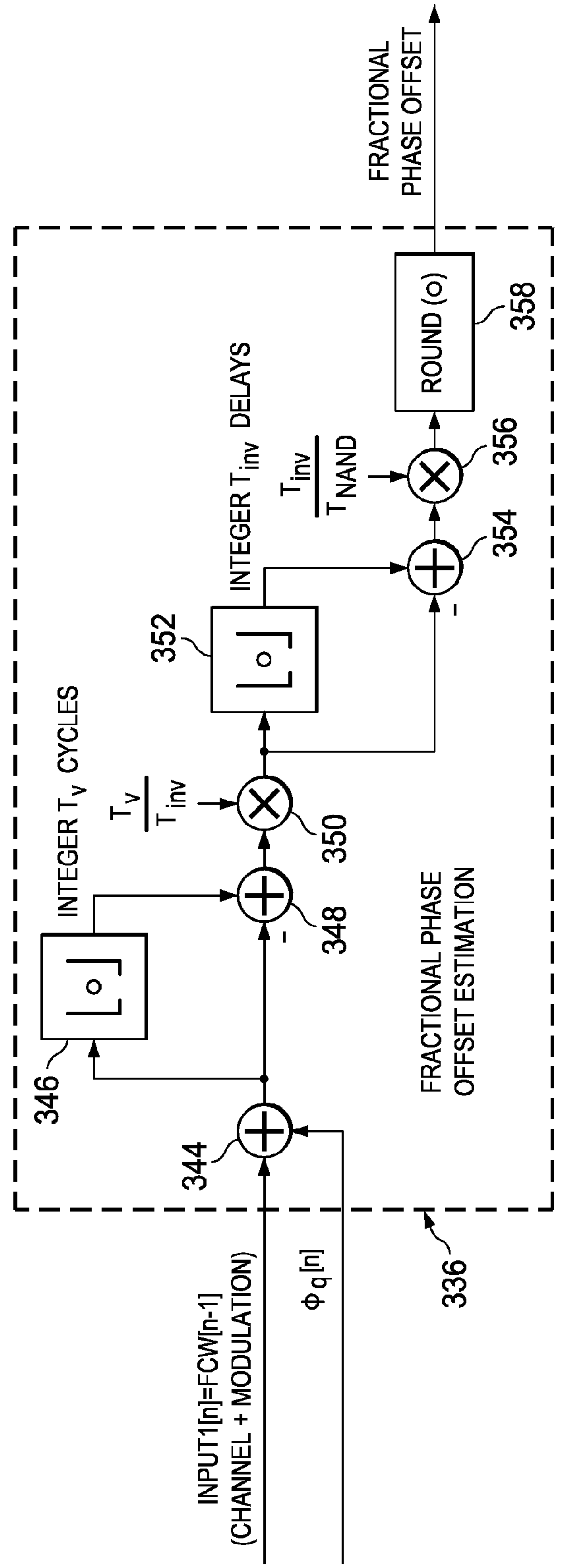
FIG. 22 is a block diagram illustrating an example of the fractional phase offset estimation mechanism of the present invention.

A block diagram illustrating the fractional phase offset estimation mechanism of the present invention is shown in FIG. 22. The fractional phase offset estimation circuit, generally referenced 336, comprises adders 344, 348, 354, floor functions 346, 352 (the greatest integer less than or equal to the number), multipliers 350, 356 and round function 358.

The circuit 336 is operative to estimate the CKV clock edge for the next reference clock edge (i.e. cycle) in terms of NAND gate delays or, in general, fractional delay of an inverter. The output of the circuit is in terms of NAND gate resolution. The clock edge can be estimated with fairly good accuracy as the DCO drifts only by a very small amount (<2 ps) within a reference clock interval. The drift from one reference clock to another and the resulting error is thus very small.

The value (phase offset) output of this block 336 is typically much smaller than the resolution of the TDC (<20 ps). The phase offset is added with the negative slope of the DCO drift multiplied by the NAND delay (5 ps in this example embodiment). The sum is then added to the input of the TDC circuit along with the FREF noise after a delay 332 via time-domain adder 314 (FIG. 19). The result of the multiplication above (the DCO correction or gamma) is also added to the output of the TDC circuit 316 via adder 318 after a delay 322.

Simulation Results

The TDC quantization noise shaping mechanism can be verified by implementing the discrete time domain model of ADPLL as described in FIG. 3 and running a simulation with and without the benefit of the present invention. The simulation was performed using Matlab software on integer channel 1664.0 MHz and non-integer channel 1696.7 MHz, both without modulation. The reference clock (FREF) frequency is assumed to be 26 MHz. For all cases the initial state of the ADPLL is chosen arbitrarily (i.e. using random number generation). In the following examples, the reference clock jitter is 2 ps so that the TDC quantization noise (20 ps) dominates. The NAND gate delays are assumed to be 5 ps. The simulations shows a consistent RMS phase error of 0.4 deg for both integer and non-integer channels. Note that the mechanism of the present invention can be applied to the ADPLL with FM modulation as well.

Case 1: 1664.0 MHz Without Modulation (Integer Channel)

Figure 23:
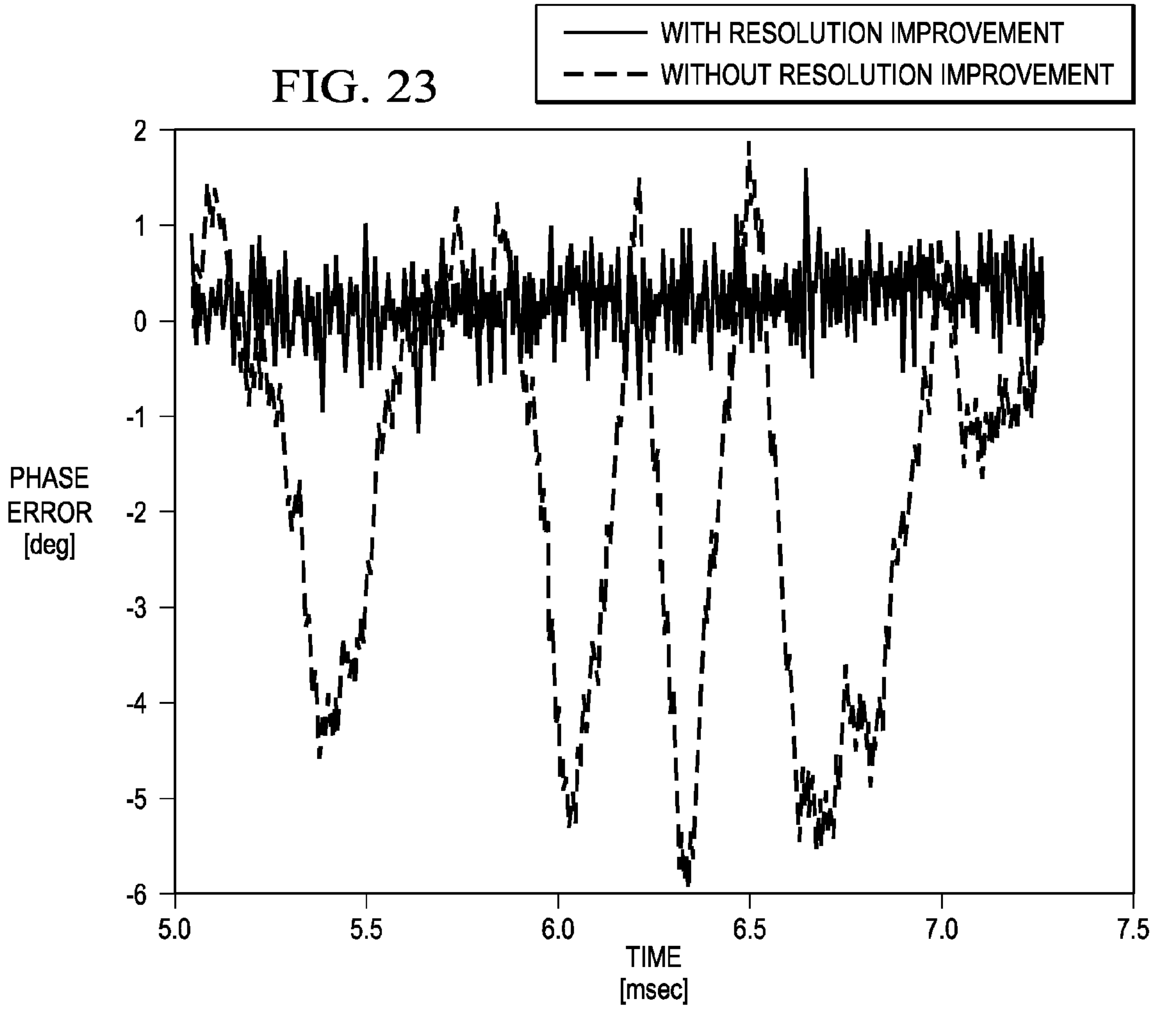
FIG. 23 is a graph illustrating the improvement of the ADPLL output phase error using the mechanism of the invention in the case of an integer channel.

A graph illustrating the improvement of the ADPLL output phase error using the mechanism of the invention in the case of an integer channel is shown in FIG. 23. This figure shows the phase noise improvement due to the TDC resolution improvement algorithm. The large uncorrected DCO phase drift (dashed curve) is due to TDC quantization noise. The algorithm induces the phase noise of the CKV clock at the edges of the inverter delay interval thereby increasing the overall TDC resolution, as shown in the solid curve.

Figure 24:
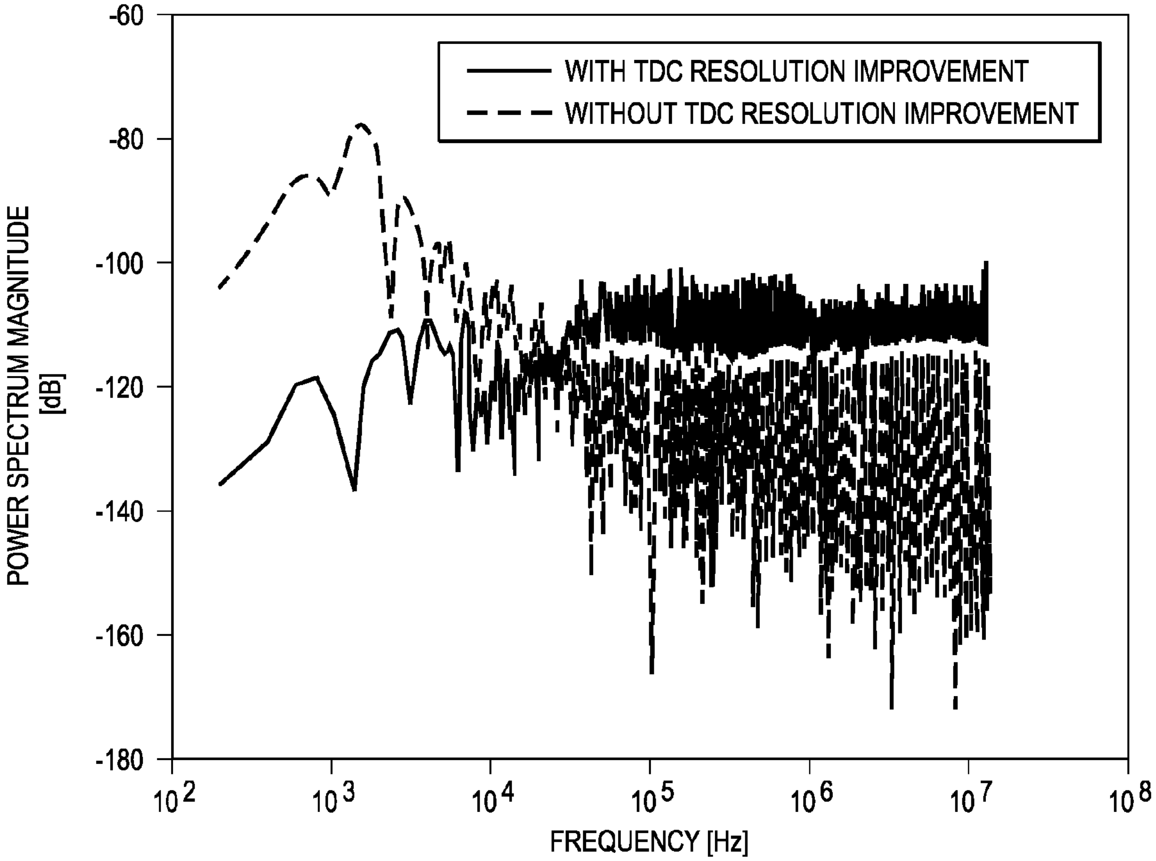
FIG. 24 is a graph illustrating the spectrum of the TDC quantization noise for the integer channel case.

A graph illustrating the spectrum of the TDC quantization noise for the integer channel case is shown in FIG. 24. This figure shows the spectrum of the TDC quantization noise without (dashed curve) and with (solid curve) resolution improvement. In this example, the TDC resolution improvement algorithm significantly shapes the quantization noise energy and thereby the integrated phase noise within the PLL loop bandwidth (~30 kHz) is greatly reduced. This results in an improvement in the overall RMS phase error performance (2 degrees RMS to 0.3 degrees RMS).

Case 2: 1666 MHz Without Modulation (Non-Integer Channel)

Figure 25:
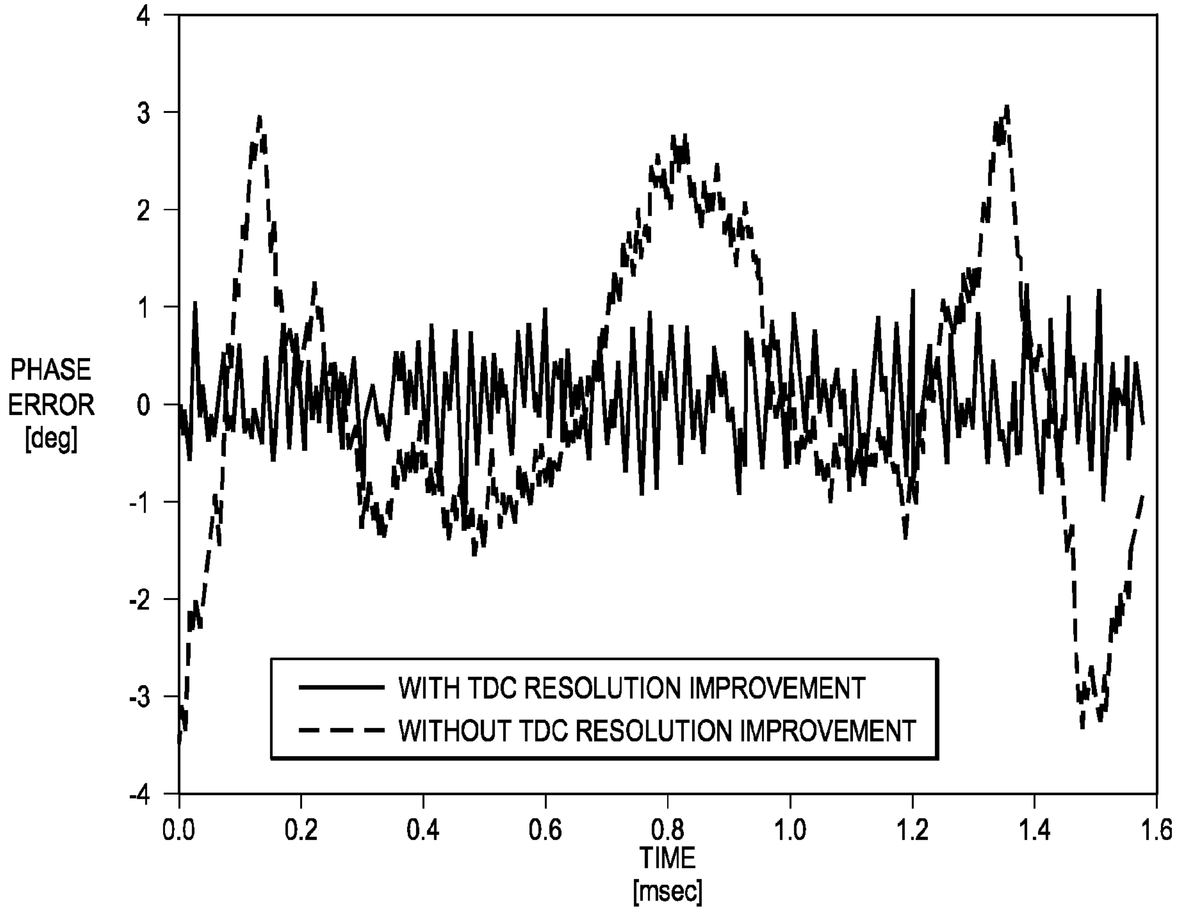
FIG. 25 is a graph illustrating the improvement of the ADPLL output phase error using the mechanism of the invention in the case of a non-integer channel.

A graph illustrating the improvement of the ADPLL output phase error using the mechanism of the invention in the case of a non-integer channel is shown in FIG. 25. In this example, a fractional channel is chosen to demonstrate the benefit of the TDC resolution improvement algorithm. It demonstrates that the algorithm shows a steady ~0.2 degree RMS phase error. This is an improvement from 1.6 degree RMS phase error.

Figure 26:
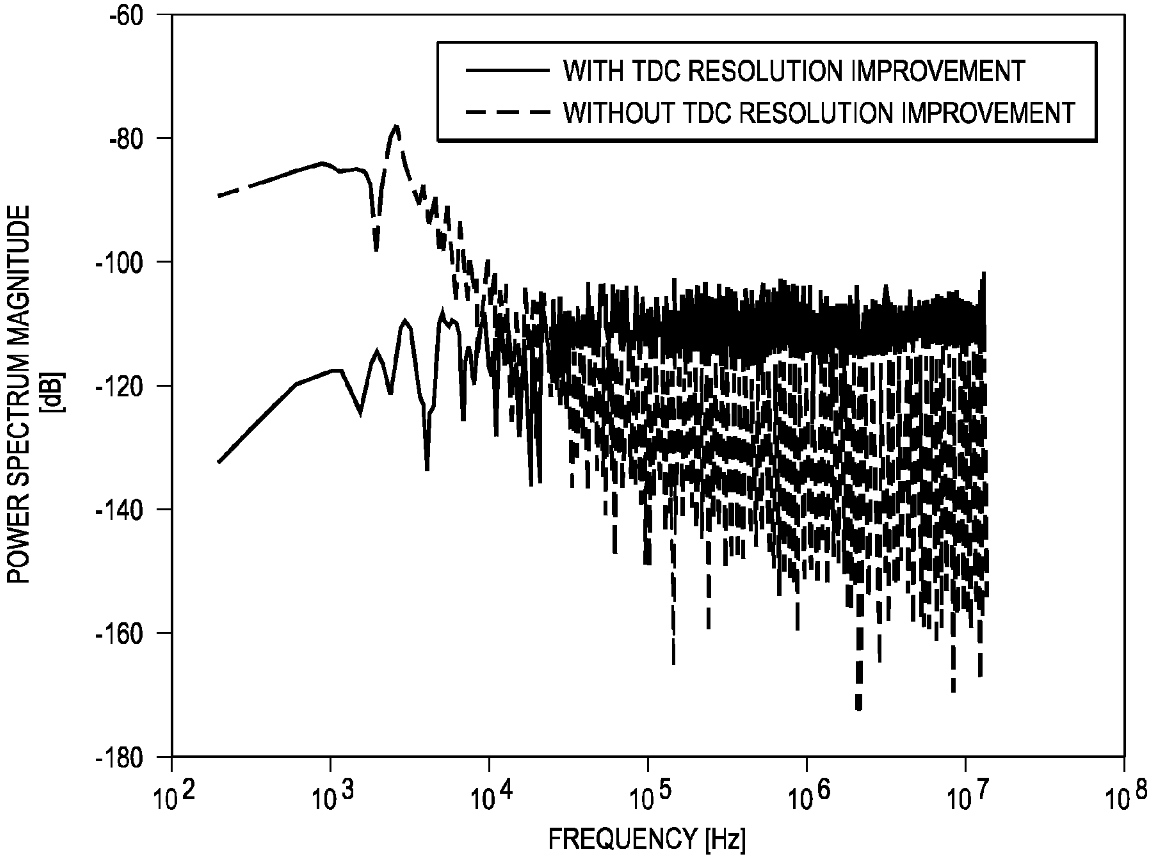
FIG. 26 is a graph illustrating the spectrum of the TDC quantization noise for the non-integer channel case.

A graph illustrating the spectrum of the TDC quantization noise for the non-integer channel case is shown in FIG. 26. In this figure, the spectrum without the benefit of the TDC resolution improvement is shown in the dashed curve, while the spectrum with the TDC resolution improvement is shown in the solid curve. The noise shaping performed in this case also improves the overall RMS phase error.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of adaptively reducing quantization noise in a closed loop control system, said method comprising the steps of:

providing a reference analog quantity;

providing a variable analog quantity;

applying dithered spectral noise shaping to said reference analog quantity to generate a reference noise shaped quantity;

calculating a quantized difference between said reference noise shaped quantity and said variable analog quantity; and filtering said quantized difference to obtain a control signal of said variable analog quantity;

wherein said step of applying comprises shifting quantization noise of said reference noise shaped quantity outside a loop bandwidth of said control system.

2. The method according to claim 1, wherein said reference analog quantity comprises a frequency reference input.

3. The method according to claim 1, wherein said variable analog quantity comprises a controllable oscillator.

4. The method according to claim 3, wherein said controllable oscillator comprises a digitally controlled oscillator (DCO).

5. A method of reducing effects of quantization noise in a time to digital converter (TDC) in a phase locked loop (PLL), comprising:

determining a noise shaping sequence to apply to a frequency reference clock in accordance with an output of said TDC; and applying said noise shaping sequence to said frequency reference clock thereby aligning edges of said frequency reference clock with respect to the edges of an RF oscillator clock with an adaptive offset such that TDC quantization noise is reduced.

6. The method according to claim 5, wherein the application of said noise shaping sequence to said frequency reference clock reduces quantization noise by adaptively dithering the edges of said frequency reference clock to yield high pass frequency shaped quantization noise that is subsequently pushed outside the loop bandwidth of said PLL.

7. The method according to claim 5, wherein the dithering of said frequency reference clock is performed with finer resolution than a TDC delay resolution.

8. The method according to claim 5, wherein a fractional estimate of said RF oscillator clock edge is in terms of NAND gate delay.

9. The method according to claim 5, wherein a fractional estimate of said RF oscillator clock edge is represented in terms of the resolution of a frequency reference delay control circuit.

10. A method of shaping time to digital converter (TDC) quantization noise for use in a phase locked loop (PLL), said method comprising the steps of:

providing a frequency reference clock signal;

determining a dither to apply to said frequency reference clock signal in accordance with an output of said TDC; and dithering said frequency reference clock signal in accordance with said dither to yield high pass frequency shaped quantization noise.

11. The method according to claim 10, wherein said high pass frequency shaped quantization noise is subsequently pushed outside the loop bandwidth of said PLL.

12. The method according to claim 10, wherein the dithering of said frequency reference clock signal is performed with finer resolution than a TDC delay resolution.

13. The method according to claim 10, wherein said noise shaping comprises sigma delta noise shaping.

14. The method according to claim 10, wherein said noise shaping concentrates quantization noise in particular frequency bins that are subsequently filtered by a PLL loop filer.

15. The method according to claim 10, further comprising the step of enhancing noise shaping by applying said TDC function on both rising and falling edges of said frequency reference clock signal.

16. The method according to claim 10, wherein said frequency reference clock signal comprises a 26 MHz clock.

17. The method according to claim 10, wherein said dither comprises a sample as a portion of a sequence.

18. A method of improving resolution of a time to digital converter (TDC) for use in a phase locked loop (PLL) incorporating a controllable oscillator, said method comprising the steps of:

providing a frequency reference clock signal;

estimating drift direction of said controllable oscillator;

determining a phase offset of an RF output signal of said controllable oscillator with respect to said frequency reference clock signal;

detecting low frequency activity in an output signal of said TDC; and applying dithering to an input of said TDC in a direction opposite to the drift direction of said controllable oscillator, thereby frequency shaping quantization noise of said TDC.

19. The method according to claim 18, wherein said frequency shaping is adapted to shift said quantization noise outside the loop bandwidth of said PLL.

20. The method according to claim 18, wherein said controllable oscillator drift direction is estimated as a function of the output of a PLL loop filter.

21. The method according to claim 18, wherein said phase offset is determined as a function of a frequency command input and shaped TDC output signal.

22. The method according to claim 18, wherein said low frequency activity is detected as a function of said TDC output signal both before and after application of said dithering.

23. The method according to claim 18, wherein said frequency reference clock signal comprises a fixed clock.

24. The method according to claim 18, wherein said step of dithering comprises providing a dither delay element adapted to slow down signal rise and fall times.

25. The method according to claim 18, wherein said dithering comprises a dither delay signal expressed in terms of gate delay.

26. The method according to claim 18, wherein said dithering is of finer resolution than the resolution of said TDC delay.

27. The method according to claim 18, wherein said controllable oscillator comprises a digitally controlled oscillator (DCO).

28. A time to digital converter (TDC) for use in a phase locked loop (PLL), comprising:

measurement means for measuring a quantized time difference between a frequency reference clock and an RF oscillator clock;

noise shaping means coupled to said measurement means, said noise shaping means comprising:

means for determining a dither to apply to said frequency reference clock in accordance with said measured quantized time difference; and means for dithering said frequency reference clock in accordance with said dither resulting in high pass frequency noise shaping of said quantized time difference.

29. The time to digital converter according to claim 28, wherein noise of said quantized time difference is pushed outside the loop bandwidth of said PLL.

30. The time to digital converter according to claim 28, wherein said dithering is of finer resolution than resolution of said quantized time difference.

31. The time to digital converter according to claim 28, wherein said frequency reference clock comprises a substantially fixed clock.

32. The time to digital converter according to claim 28, wherein said RF oscillator clock in said measurement means denotes a significant edge immediately after an edge of said reference frequency clock.

33. The time to digital converter according to claim 28, wherein said RF oscillator clock in said measurement means denotes a significant edge immediately before an edge of said reference frequency clock.

34. The time to digital converter according to claim 28, wherein said dither comprises a sample and portion of a sequence.

35. A radio, comprising:

a transmitter, said transmitter comprising a phase locked loop (PLL) incorporating a time to digital converter (TDC) circuit, said TDC circuit comprising:

measurement means for measuring a quantized time difference between a frequency reference clock and a radio frequency (RF) oscillator clock;

noise shaping means coupled to said measurement means, said noise shaping means comprising:

means for determining a dither to apply to said frequency reference clock in accordance with said measured quantized time difference;

means for dithering said frequency reference clock in accordance with said sequence resulting in high pass frequency shaped TDC quantization noise;

a receiver; and a baseband processor coupled to said transmitter and said receiver.

36. The radio according to claim 35, wherein said high pass frequency shaped quantization noise is subsequently pushed outside the loop bandwidth of said PLL.

37. The radio according to claim 35, wherein said dithering is of finer resolution than the resolution of said quantized time difference.

38. The radio according to claim 35, wherein said frequency reference clock comprises a substantially fixed clock.

39. A mobile communications device, comprising:

a cellular radio comprising a transmitter and receiver;

said transmitter comprising a phase locked loop (PLL) incorporating a time to digital converter (TDC) circuit, said TDC circuit comprising:

measurement means for measuring a quantized time difference between a frequency reference clock and a radio frequency (RF) oscillator clock;

noise shaping means coupled to said measurement means, said noise shaping means comprising:

means for determining a dither to apply to said frequency reference clock in accordance with said measured quantized time difference;

means for dithering said frequency reference clock in accordance with said dither resulting in high pass frequency shaped TDC quantization noise;

a baseband processor coupled to said transmitter and receiver.

40. The radio according to claim 39, wherein said high pass frequency shaped quantization noise is subsequently pushed outside the loop bandwidth of said PLL.

41. The radio according to claim 39, wherein said dithering is of finer resolution than the resolution of said time difference.

42. The radio according to claim 39, wherein said frequency reference clock comprises a substantially fixed clock.

* * * * *